(12) United States Patent
Kim et al.

(10) Patent No.: US 10,122,083 B2
(45) Date of Patent: Nov. 6, 2018

(54) ANTENNA DEVICE

(71) Applicant: KMW INC., Hwaseong-si (KR)

(72) Inventors: In-Ho Kim, Yongin-si (KR);
Hyoung-Seok Yang, Hwaseong-si
(KR); Hee Kim, Yongin-si (KR)

(73) Assignee: KMW Inc., Hwaseong-si (KR)

( * ) Notice: Subject to any disclaimer, the term of this patent is extended or adjusted under 35 U.S.C. 154(b) by 0 days.

(21) Appl. No.: 15/584,149

(22) Filed: May 2, 2017

(65) Prior Publication Data

US 2017/0237160 A1    Aug. 17, 2017

Related U.S. Application Data

(63) Continuation of application No. PCT/KR2015/011699, filed on Nov. 3, 2015.

(30) Foreign Application Priority Data

Nov. 4, 2014 (KR) .......... 10-2014-0152227
Jul. 3, 2015 (KR) .......... 10-2015-0095469

(51) Int. Cl.
*H01Q 3/06* (2006.01)
*B23P 11/00* (2006.01)
(Continued)

(52) U.S. Cl.
CPC .............. *H01Q 3/06* (2013.01); *B23P 11/00* (2013.01); *B23P 19/00* (2013.01); *B25J 15/04* (2013.01);
(Continued)

(58) Field of Classification Search
CPC ............. H01Q 1/12; H01Q 3/06; H01Q 13/08
See application file for complete search history.

(56) References Cited

U.S. PATENT DOCUMENTS

| | | | |
|---|---|---|---|
| 2009/0207094 A1 | 8/2009 | Yang et al. | |
| 2014/0033496 A1 | 2/2014 | Lettkeman et al. | |
| 2014/0179244 A1* | 6/2014 | Colapietro | H04B 1/40 455/90.2 |

FOREIGN PATENT DOCUMENTS

| | | |
|---|---|---|
| CN | 201233948 Y | 5/2009 |
| CN | 201247823 Y | 5/2009 |

(Continued)

OTHER PUBLICATIONS

International Search Report for PCT/KR2015/010105 dated Feb. 16, 2016, and English translation thereof.

(Continued)

*Primary Examiner* — Hoang Nguyen

(57) ABSTRACT

An antenna device according to one of various examples of the present invention can comprise: an antenna module; a radio remote head (RRH) for receiving signals from the antenna module and a base station; guide modules for guiding the RRH such that the RRH slidably moves in an inclined state in the antenna module, for providing one end portion of the RRH to be rotated, and for providing the other end portion of the RRH to move vertically in the sliding movement direction; connection modules provided on a surface on which the antenna module and the RRH face each other, and electrically connecting the RRH and the antenna module; and coupling modules provided on one side of the RRH so as to move the connection modules, thereby mutually coupling or separating the connection modules.

19 Claims, 26 Drawing Sheets

(51) Int. Cl.
*B23P 19/00* (2006.01)
*B25J 15/04* (2006.01)
*B64G 1/66* (2006.01)
*G06F 15/02* (2006.01)
*H01F 1/00* (2006.01)
*H01Q 1/12* (2006.01)
*H01Q 13/08* (2006.01)
*H05K 7/12* (2006.01)
*H05K 5/00* (2006.01)
*H01Q 1/24* (2006.01)

(52) U.S. Cl.
CPC ............... *B64G 1/66* (2013.01); *G06F 15/02* (2013.01); *H01F 1/00* (2013.01); *H01Q 1/12* (2013.01); *H01Q 1/246* (2013.01); *H01Q 13/08* (2013.01); *H05K 5/0021* (2013.01); *H05K 7/12* (2013.01)

(56) References Cited

FOREIGN PATENT DOCUMENTS

| | | |
|---|---|---|
| EP | 2642612 A1 | 9/2013 |
| EP | 2747194 A1 | 6/2014 |
| EP | 3113284 A1 | 1/2017 |
| JP | S60-59570 U | 4/1985 |
| JP | S62-41413 A | 2/1987 |
| JP | 05-006880 U | 1/1993 |
| JP | 05-185999 A | 7/1993 |
| JP | 2004-512719 A | 4/2004 |
| JP | 2004-356728 A | 12/2004 |
| KR | 10-2002-0064005 A | 8/2002 |

OTHER PUBLICATIONS

The Extended European Search Report dated May 11, 2018 for European Application No. 15857774.2.

\* cited by examiner

FIG. 20A
FIG. 20B
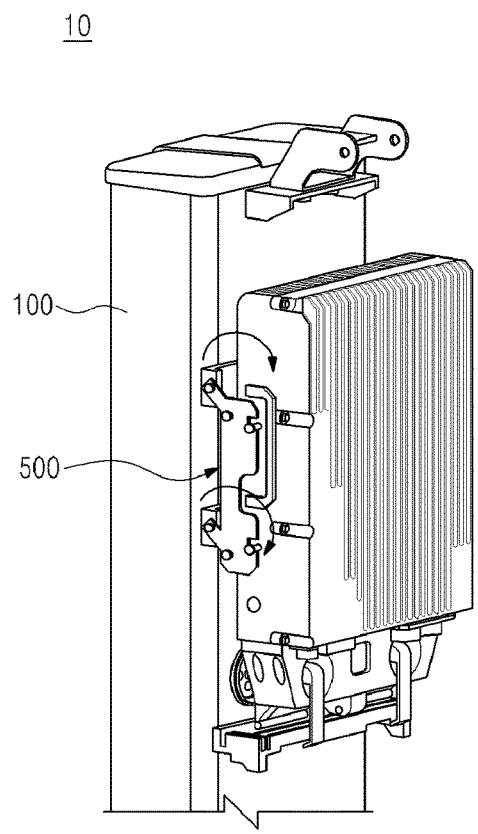
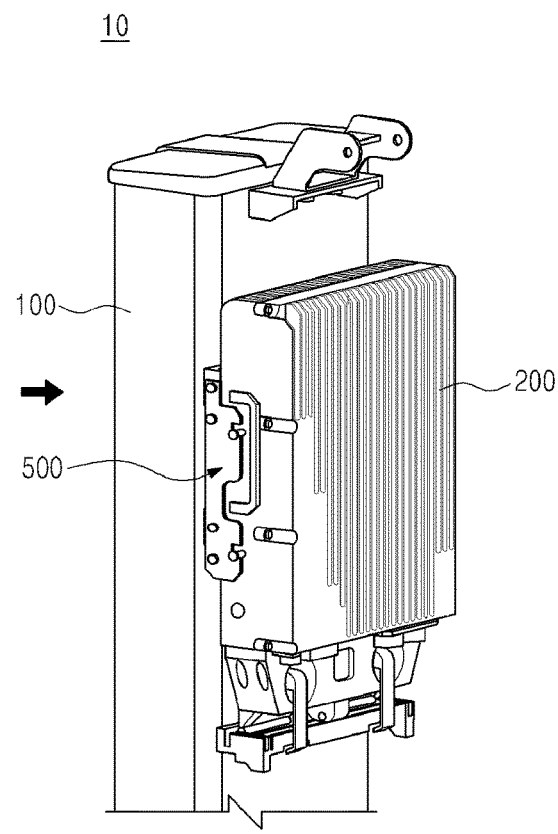

ANTENNA DEVICE

CROSS-REFERENCE TO RELATED APPLICATIONS

This application is a continuation application of International Application No. PCT/KR2015/011699, filed on Nov. 3, 2015, which claims the benefit of and priority to Korean Patent Application No. 10-2014-0152227, filed on Nov. 4, 2014, and Korean Patent Application No. 10-2015-0095469, filed on Jul. 3, 2015, the contents of which are incorporated herein by reference in their entirety.

TECHNICAL FIELD

The present disclosure relates to an antenna device, and more particularly, to an antenna device that can enable an antenna module and a radio remote head (RRH) to be easily attached to or detached from each other.

BACKGROUND ART

With the popularization of wireless mobile communication services, antenna devices have been spread and extended to provide wireless network environments capable of providing the services more stably. In particular, for the wireless mobile communication services, a 4G mobile communication technology that is based on Long Term Evolution (LTE) capable of operating to transmit and receive various data signals has been used through $2^{nd}$ generation (2G) communication technology that enables only a wired phone call to be performed and $3^{rd}$ generation (3G) communication technology. An antenna device for such a 4G mobile communication is mounted together with the existing 3G antenna to share installation positions. However, a 3G repeater (hereinafter referred to as "3G radio remote head (RRH)") that is connected to a 3G-based antenna to receive signals from the 3G antenna and a base station and a 4G repeater (hereinafter referred to as "4G radio remote head (RRH)") that is connected to a 4G-based antenna to receive signals from the 4G antenna and the base station are separately formed.

In the antenna device having such a structure in which an antenna module and an RRH are integrally provided, if a malfunction or trouble of the RRH occurs, the entire antenna should be separated from an outer wall. Further, in the case where the antenna module and the RRH are separately provided to be coupled to each other, a tool for separating the RRH from the antenna module is needed since the antenna device is mounted on the outer wall of a high-rise building or a high support. If such a tool for coupling/separating the RRH to/from the antenna module is dropped from a high position, it may cause a risk of safety accident.

Further, in the case of using the tool to couple/separate the RRH that is mounted on the outer wall of the high-rise building or the high support to/from the antenna module, it may be difficult for a person to use both the RRH and the tool at the high position.

DISCLOSURE

Technical Problem

One aspect of the present disclosure is to provide an antenna device in which an RRH is integrally formed with an antenna module and the RRH can be simply and easily attached to or detached from the antenna module.

Another aspect of the present disclosure is to provide an antenna device which can facilitate electrical attachment/detachment of an antenna module and an RRH to/from each other when the RRH is attached to or detached from the antenna module.

Technical Solution

In one aspect of the present disclosure, an antenna device includes: an antenna module; a radio remote head (RRH) for receiving signals from the antenna module and a base station; guide modules for guiding the RRH such that the RRH slidably moves in an inclined state on the antenna module, for providing one end portion of the RRH to be rotated, and for providing the other end portion of the RRH to move vertically in the sliding movement direction; connection modules provided on a surface on which the antenna module and the RRH face each other, and electrically connecting the RRH and the antenna module; and coupling modules provided on one side of the RRH so as to move the connection modules, thereby mutually coupling or separating the connection modules.

In another aspect of the present disclosure, an antenna device includes: an antenna module; a radio remote head (RRH) configured to receive signals from the antenna module and a base station; an attachment/detachment member configured to attach/detach the RRH to/from one surface of the antenna module; connection modules provided on a surface on which the antenna module and the RRH face each other to electrically connect the RRH and the antenna module to each other; and coupling modules provided on one surface of the RRH to move the connection modules so that the connection modules are coupled to or separated from each other.

Advantageous Effects

As described above, the antenna device according to embodiments of the present disclosure has the advantage that the RRH and the antenna module can be formed in a body, and thus the coupling of the antenna device onto the outer wall can be easily performed.

Further, the RRH can be coupled to or separated from the antenna module through only movement of the RRH on the antenna module that is coupled to the outer wall, and thus the RRH can be simply attached to or detached from the antenna module without any separate tool or attachment/detachment device when the RRH is attached to or detached from the antenna module.

Further, a separate tool is not needed when the RRH is attached to or detached from the antenna module, and in the case of performing attachment/detachment work of the RRH at the high position, a risk of safety accident that may occur when a worker uses the tool can be lowered.

Further, since a separate tool is not needed when the RRH is attached to or detached from the antenna module, replacement work due to the malfunction or trouble can be simply performed.

Further, since the RRH can be electrically coupled to or decoupled from the antenna module through only rotation of a lever portion that is provided on the rear side of the RRH, electrical coupling between the RRH and the antenna module can be easily performed.

Further, since the antenna device according to the present disclosure has a blind mating structure in which terminals of the connection modules for electrically connecting the RRH and the antenna module to each other are not exposed to an outside, a stable coupling structure can be maintained, and coupling reliability of the connection modules can be improved.

DESCRIPTION OF DRAWINGS

FIGS. 20A and 20B are views illustrating a state before an RRH is attached to the rear surface of an antenna module in an antenna device according to one of various embodiments of the present disclosure.

Figure 1:
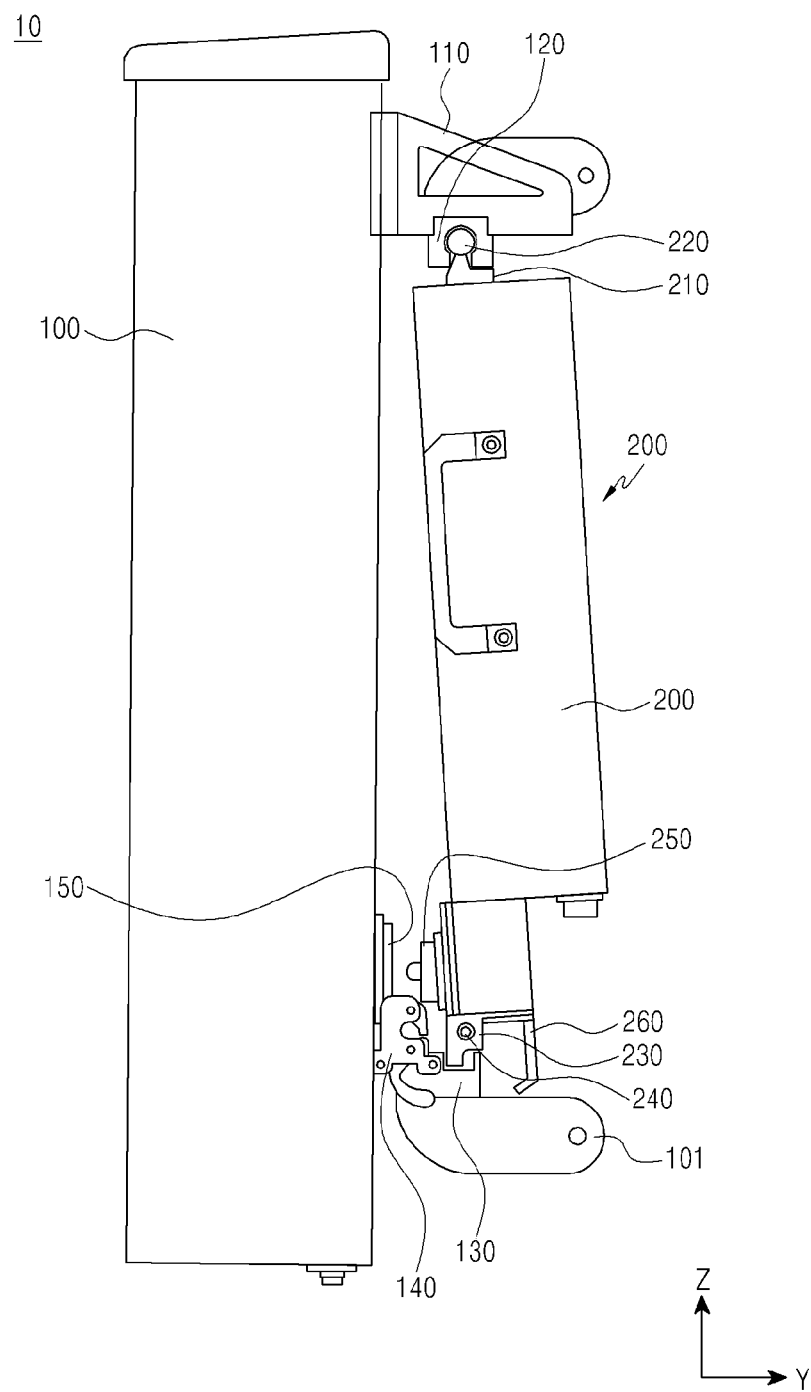
FIG. 1 is a view schematically illustrating an antenna device according to an embodiment of the present disclosure.

| | |
|---|---|
| 10: antenna device | 100: antenna module |
| 120: first guide portion | 130: second guide portion |
| 140: fixing member | 150: first connection portion |
| 200: RRH | 220: first sliding portion |
| 230: second sliding portion | 240: locking member |
| 250: second connection portion | |

BEST MODE

The present disclosure may be variously modified and may have various embodiments, and some embodiments of the present disclosure will be described in detail with reference to the accompanying drawings. However, it should be understood that the present disclosure is not limited to the specific embodiments described hereinafter, but includes various modifications, equivalents, and/or alternatives that are included in the scope of the present disclosure.

In the description, the terms including ordinal numbers, such as "first, second, and so forth", are used to describe diverse elements regardless of their order and/or importance and to discriminate one element from other elements, but are not limited to the corresponding elements. For example, without departing from the scope of the present disclosure, a first element may be called a second element, and the second element may be called the first element in a similar manner. Also, the term "and/or" includes the respective described items and combinations thereof.

Further, relative terms that are described on the basis of those as seen in the drawings, such as "front, rear, upper, and lower", may be replaced by ordinal numbers, such as "first, second, and so forth". The order of the ordinal numbers, such as "first, second, and so forth", may be the above-described order or may be optionally determined, and may also be optionally changed if needed.

The terms used herein are for the purpose of describing specific embodiments only, but are not intended for limiting the present disclosure. A singular expression may include a plural expression unless specially described. In the present disclosure, it should be understood that the term "includes" or "has" used in the present disclosure specifies the presence of stated features, steps, operations, components, parts mentioned in the present disclosure, or a combination thereof, but do not preclude the presence or addition of one or more other features, numerals, steps, operations, components, parts, or a combination thereof.

Unless differently defined, all terms (including technical and scientific terms) used in the description could be used as meanings commonly understood by those ordinary skilled in the art to which the present disclosure belongs. The terms that are used in the present disclosure and are defined in a general dictionary may be used as meanings that are identical or similar to the meanings of the terms from the context of the related art, and they are not interpreted ideally or excessively unless they have been clearly and specially defined. According to circumstances, even the wordings that are defined in the present disclosure are not interpreted to exclude the embodiments of the present disclosure.

Prior to explanation of the present disclosure, a first direction X is a direction that is measured from one side to the other side of an antenna module 100 that is installed on an outer wall 10, and in the drawings, the first direction is indicated as an X-axis direction. Further, a second direction Y is a direction in which the antenna module 100 that is installed on the outer wall 10 and the outer wall 10 face each other, and in the drawings, the second direction is indicated as a Y-axis direction. Further, a gravity direction Z is a direction that is vertical to the first and second directions. The gravity direction Z is a direction in which the antenna module 100 is installed on the outer wall 10, and in the drawings, the gravity direction is indicated as a Z-axis direction.

Figure 2:
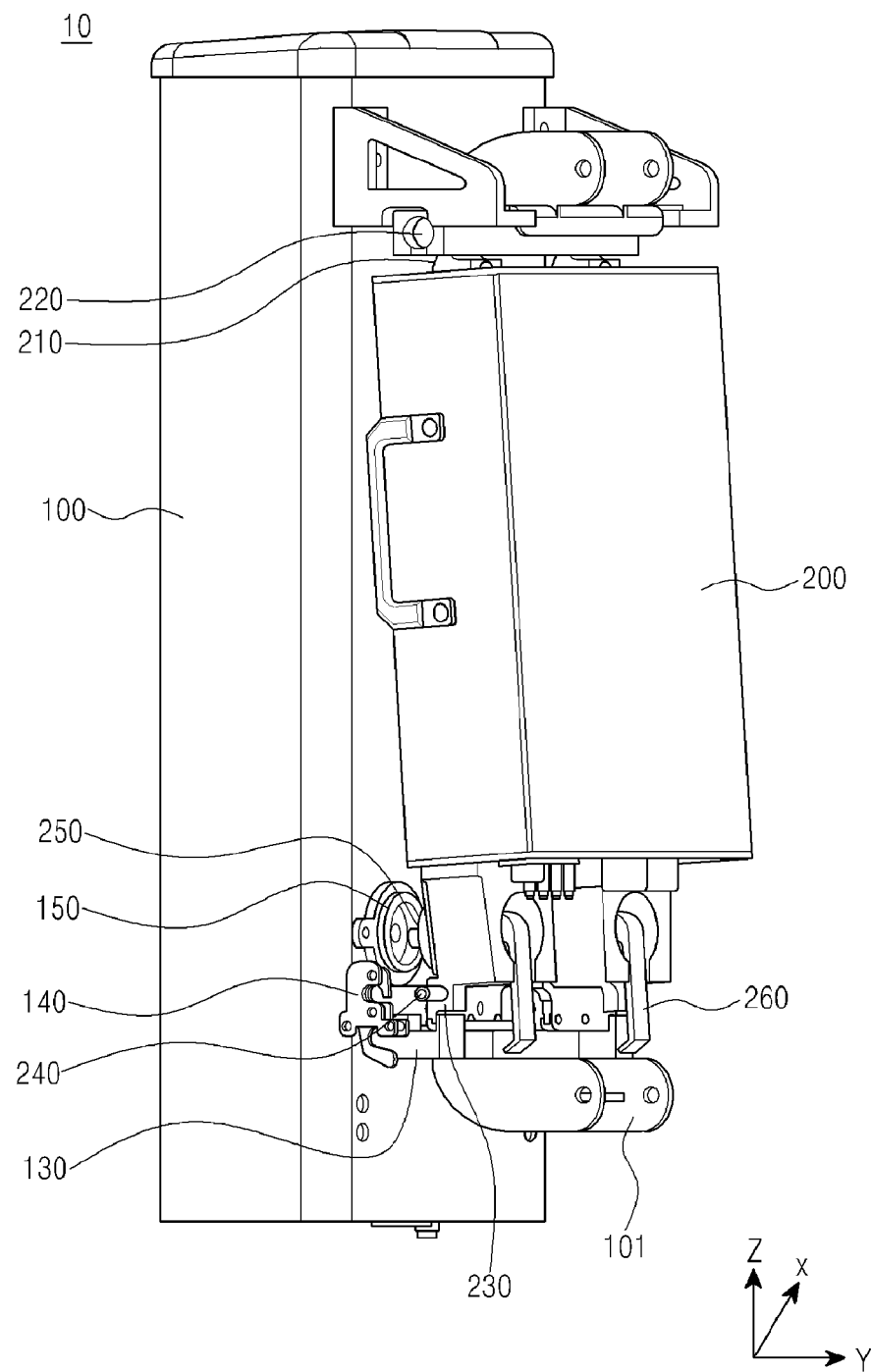
FIG. 2 is a perspective view schematically illustrating the rear side of an antenna device according to an embodiment of the present disclosure.
Figure 3:
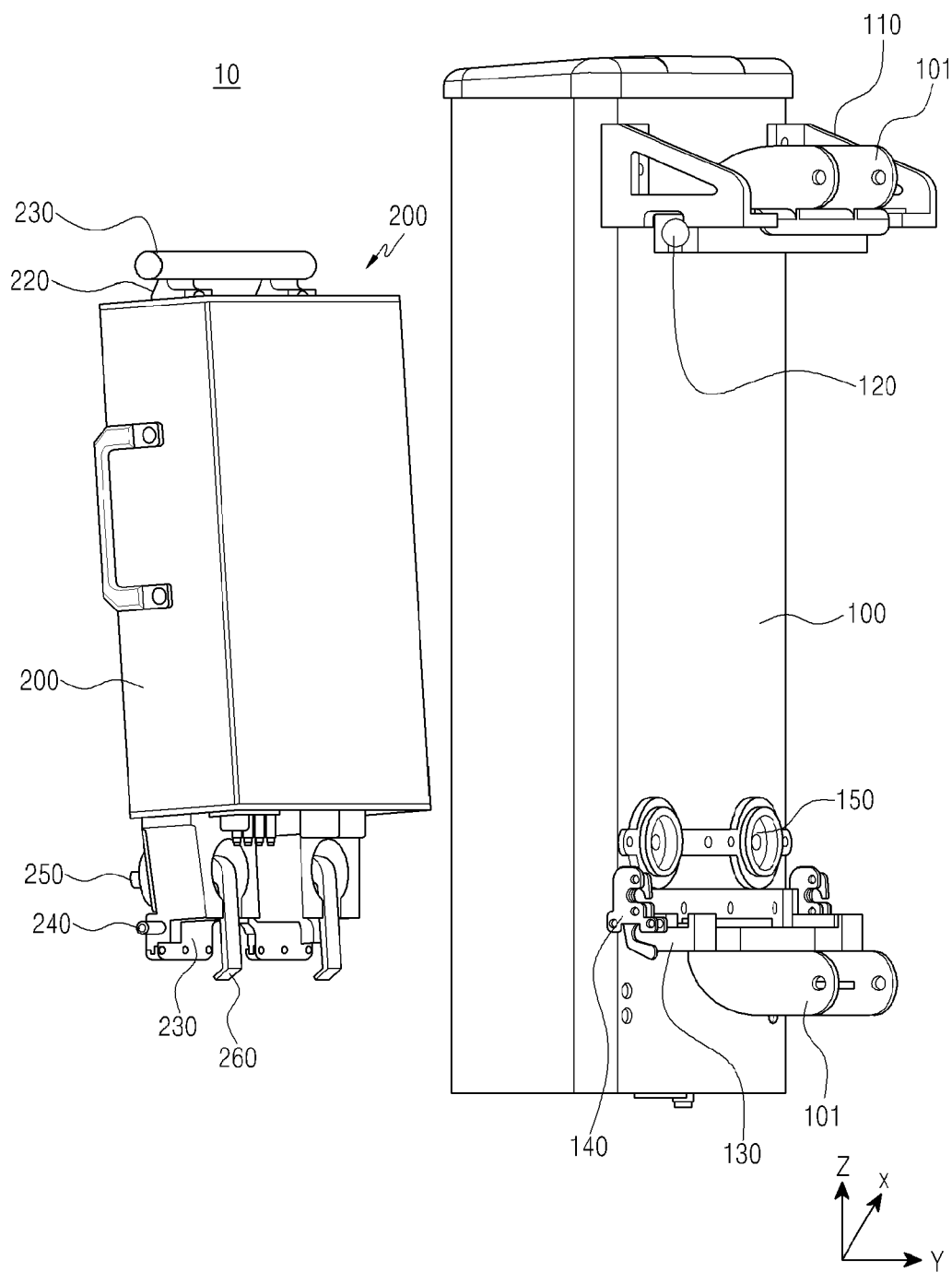
FIG. 3 is a rear-side perspective view illustrating a state where an antenna module and an RRH are separated from each other in an antenna device according to an embodiment of the present disclosure.

FIG. 1 is a view schematically illustrating an antenna device according to an embodiment of the present disclosure, and FIG. 2 is a perspective view schematically illustrating the rear side of an antenna device according to an embodiment of the present disclosure. FIG. 3 is a rear-side perspective view illustrating a state where an antenna module and an RRH are separated from each other in an antenna device according to an embodiment of the present disclosure.

Referring to FIGS. 1 to 3, an antenna device 10 according to an embodiment of the present disclosure is installed on an upright support (hereinafter referred to as "outer wall (not illustrated)"), such as an outer wall or an electric pole. The antenna device 10 may include an antenna module 100, and a radio remote head (RRH) 200 arranged to face the antenna module 100 to be connected thereto, and may include a fixing module 101 configured to fix the antenna module 100 to the outer wall. Further, the antenna device 10 according to the present disclosure may include guide modules 120, 130, 220, and 230 configured to enable the RRH 200 to be attached to or detached from the antenna module 100 that is installed on the outer wall without any separate attachment/detachment tool, coupling modules 140 and 240, and may include connection modules 150 and 250 capable of electrically connecting the RRH 200 and the antenna module 100 to each other. In the antenna device 10 according to the present disclosure, the RRH 200 is provided to be attached to or detached from the antenna module 100 without any separate tool, and the connection modules 150 and 250 have a blind mating structure, in which the antenna module 100 and the RRH 200 are blind-mated by the coupling modules 140 and 240.

In an embodiment of the present disclosure, the RRH 200 may be guided to move in an inclined state on the antenna module 100, and a lower portion of the RRH 200 (hereinafter referred to as "the other end portion of the RRH 200") is pushed or pulled to cause the other end portion of the RRH 200 to move in a direction that is vertical to the direction in which an upper portion of the RRH 200 (hereinafter referred to as "one end portion of the RRH 200") is guided to move about the one end portion of the RRH 200 as a rotation axis. Although the detailed contents are to be described later, the one end portion of the RRH 200 may be rotatably mounted on the antenna module 100 through the sliding movement thereof along the first direction X on the side of the antenna module 100. Further, the other end portion of the RRH 200 may be mounted on the antenna module 100 through the sliding movement thereof in the first direction X and the second direction Y that is vertical to the first direction X on the side of the antenna module. That is, the RRH 200 may be guided to perform sliding movement in a direction in which the RRH 200 gets near to or goes away from the antenna module 100 by a force that pushes or pulls the other end portion of the RRH 200 about the one end portion of the RRH 200 that is guided and supported on an upper portion of the antenna module 100 as the rotation axis, and thus the antenna module 100 and the RRH 200 may be arranged to face each other in a face-to-face manner. Further, as the other end portion of the RRH 200 moves to slide in the second direction Y, the connection modules 150 and 250 are engaged with each other to have a blind mating structure, in which the connection modules are blinded and electrically connected to each other between the antenna module 100 and the RRH 200.

Hereinafter, the configurations as simply described above will be described in more detail.

The antenna module 100 may be an antenna that can provide a 3G mobile communication service or an antenna that can provide a 4G mobile communication service. The antenna module 100 is formed long roughly in the gravity direction Z. As described above, on upper and lower portions of the rear side of the antenna module 100 on the basis of the gravity direction Z, the fixing module 101 is provided to support the antenna module 100 on the outer wall. On the rear surface of the antenna module 100, that is, on the surface that is provided toward the outer wall, the first connection portion 150 of the connection modules 150 and 250 that are electrically connected to the RRH 200 to be described may be inwardly formed against the surface of the antenna module 100. In an embodiment of the present disclosure, although it is exemplified that the first connection portion 150 is inwardly formed against the rear surface of the antenna module 100, and is connected to the second connection portion 250 of the connection modules 150 and 250 that is inwardly formed to be described later, the shape of the first and second connection portions 150 and 250 are not limited thereto. If the RRH 200 has the blind mating structure when being coupled to the antenna module 100, it may be possible to modify or change the shape of the first and second connection portions without limit. Further, the guide members 120 and 130 among the guide modules 120, 130, 220, and 230 may be provided on the rear side of the antenna module 100 so that the RRH 200 to be described later can be coupled to or secede from the antenna module 100.

The guide members 120 and 130 may be positioned on the upper and lower portions of the rear surface of the antenna module 100. The guide members 120 and 130 (that correspond to a first guide portion 120 to be described later) that are positioned on the upper portion of the antenna module 100 may be provided to guide sliding movement and rotating movement of a first sliding portion 220 to be described later. Further, the guide members 120 and 130 (that correspond to a second guide portion 130 to be described later) that are positioned on the lower portion of the antenna module 100 may be provided to guide sliding movement in the first direction X and sliding movement in the second direction Y that is vertical to the first direction X of a second sliding portion 230 to be described later. Accordingly, the sliding members 220 and 230 that are provided on the RRH 200 are seated and supported on the guide members 120 and 130, and as the RRH 200 slidably moves in an inclined state on the antenna module 100 to be pushed or pulled, the guide members 120 and 130 may guide attachment/detachment of the RRH 200.

The radio remote head (RRH) 200 is a module that receives signals from the antenna module 100 and the base station. The RRH 200 may be attached to or detached from the antenna module 100 through the sliding movement in the direction that is measured from one side to the other side of the rear surface of the antenna module 100 and the movement in the direction that is vertical to the sliding movement. That is, the RRH 200 is mounted on the rear surface of the antenna module 100 along the Z direction. The RRH 200 may be formed long in the gravity direction Z in a similar manner to the antenna module 100. Although not illustrated, in the RRH 200, a main board, a power amplifying unit (PAU), a power supply unit (PSU), and a heat sink may be provided.

As described above, the RRH 200 is detachably provided on the rear surface of the antenna module 100 that is installed on the outer wall. The RRH 200 is positioned between the antenna module 100 an the outer wall, and has a structure that is attached to or detached from the antenna module 100 without any separate tool through the sliding movement in the first direction X, the rotating movement, and the sliding movement in the second direction Y as being guided by the guide members 120 and 130 among the guide modules 120, 130, 220, and 230 that are provided on the rear surface of the antenna module 100. In the direction of the front surface of the RRH 200 or the front surface of the lower end portion of the RRH 200, the second connection portion 250 of the connection modules 150 and 250 may be formed to project so as to be connected to or decoupled from the first connection portion 150 that is provided on the antenna module 100 in accordance with the rotation and the movement in the second direction Y. As described above, in an embodiment of the present disclosure, it is exemplified that the second connection portion 250 is shaped to project, but is not limited thereto. So far as the first connection portion 150 and the second connection portion 250 are engaged with each other to have a blind mating structure, the shapes of the first and second connection portions 150 and 250 may be changed or modified without limit. Further, on one end portion and the other end portion of the RRH 200, the sliding members 220 and 230 among the guide modules 120, 130, 220 and 230 may be provided. Accordingly, the sliding members 220 and 230 are seated and supported on the guide members 120 and 130 among the guide modules 120, 130, 220, and 230 that are provided on the antenna module 100 to enable the RRH 200 to be detachably coupled to the antenna module 100.

The sliding members 220 and 230 are positioned on the upper and lower portions of the RRH 200. The sliding members 220 and 230 may make the RRH 200 slidably move to be mounted on or secede from the antenna module 100, specifically, the guide portion 130 to be described later. The sliding members 220 and 230 may include a first sliding portion 220 that projects upward from an upper portion of a circumferential surface of the RRH 200 and a second sliding portion 230 that projects in the outer wall direction from the lower portion of the rear surface (surface that faces the outer wall) of the RRH 200.

Figure 4:
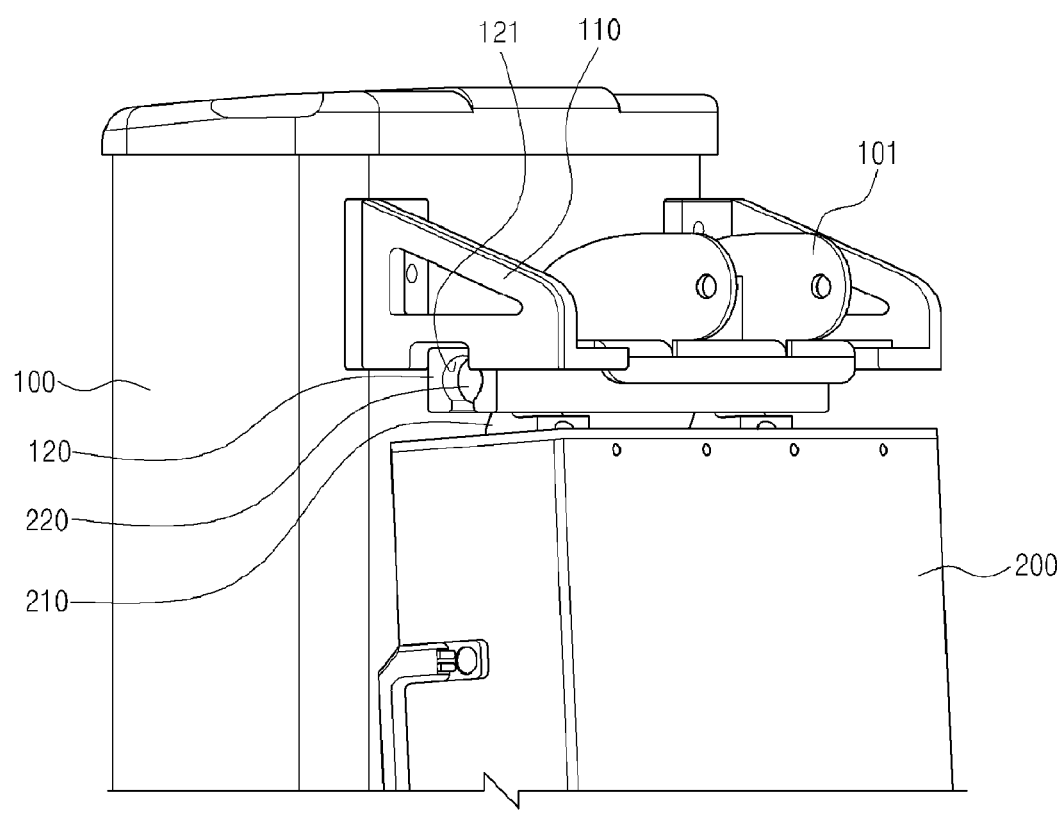
FIG. 4 is a perspective view illustrating a first guide portion and a first sliding portion in an antenna device according to an embodiment of the present disclosure.
Figure 5:
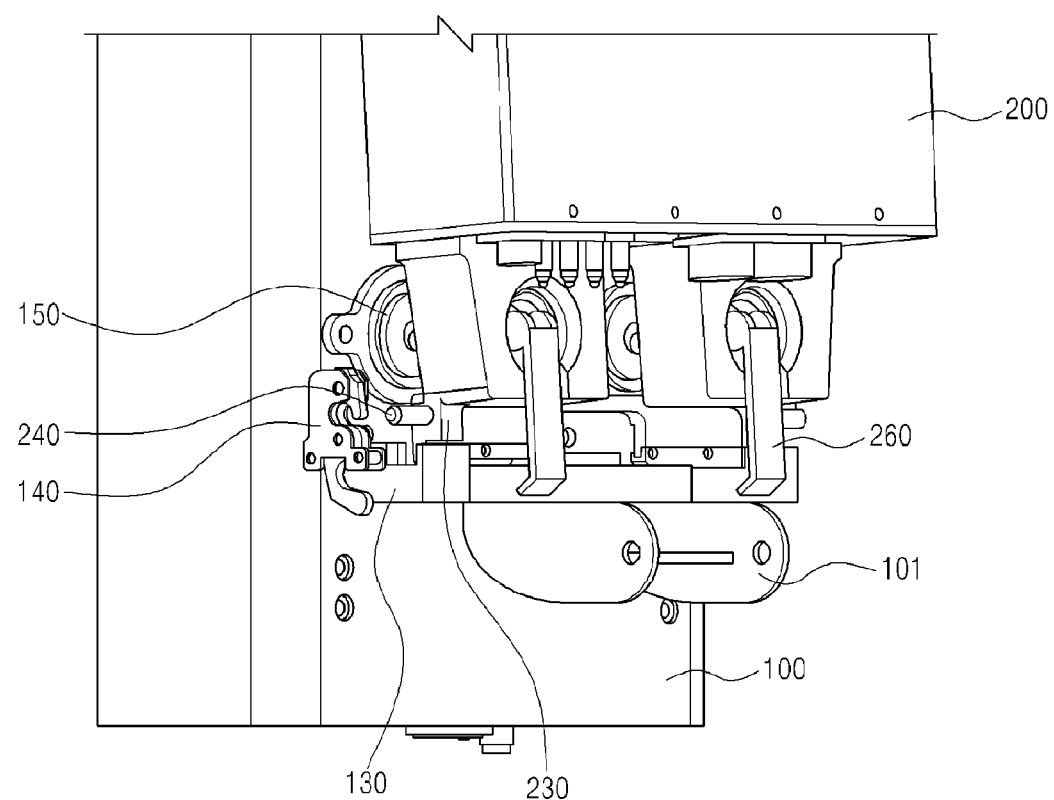
FIG. 5 is a perspective view illustrating a second guide portion and a second sliding portion in an antenna device according to an embodiment of the present disclosure.
Figure 6:
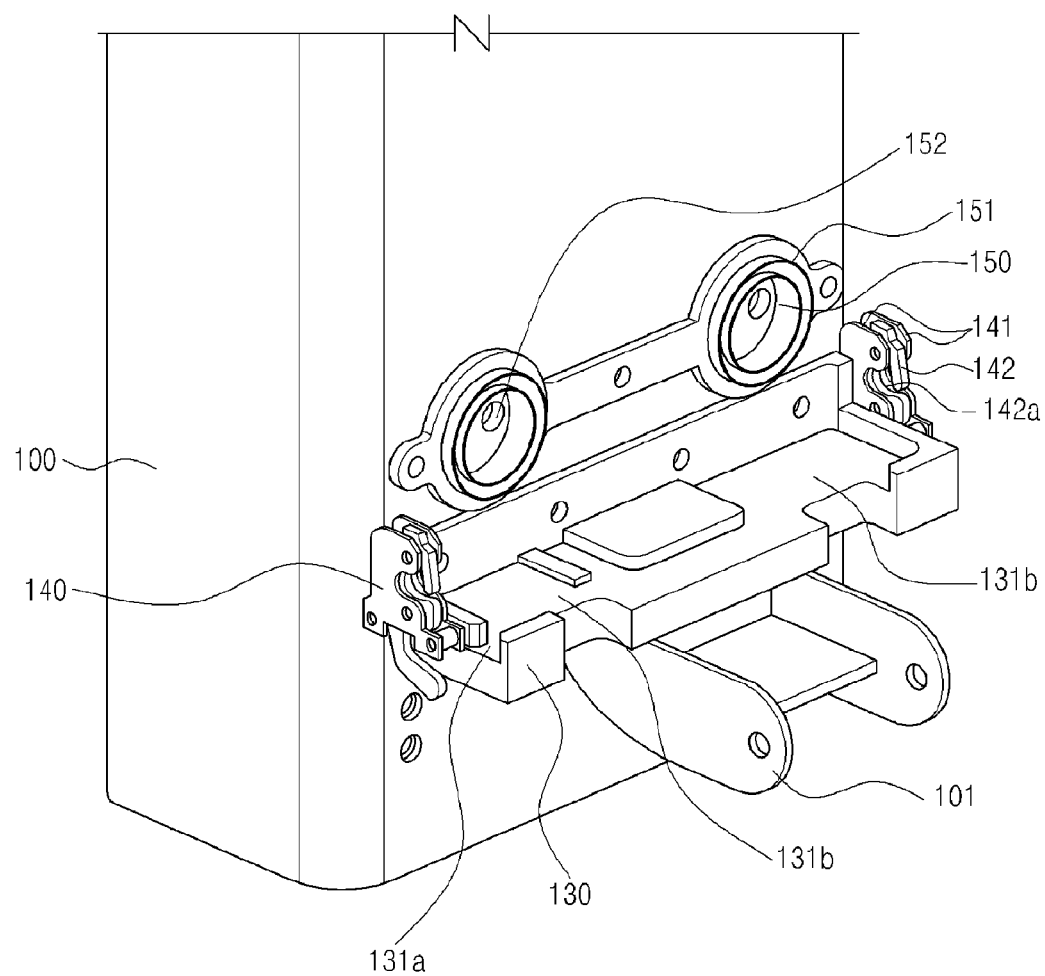
FIG. 6 is a perspective view illustrating a second guide portion in an antenna device according to an embodiment of the present disclosure.
Figure 7:
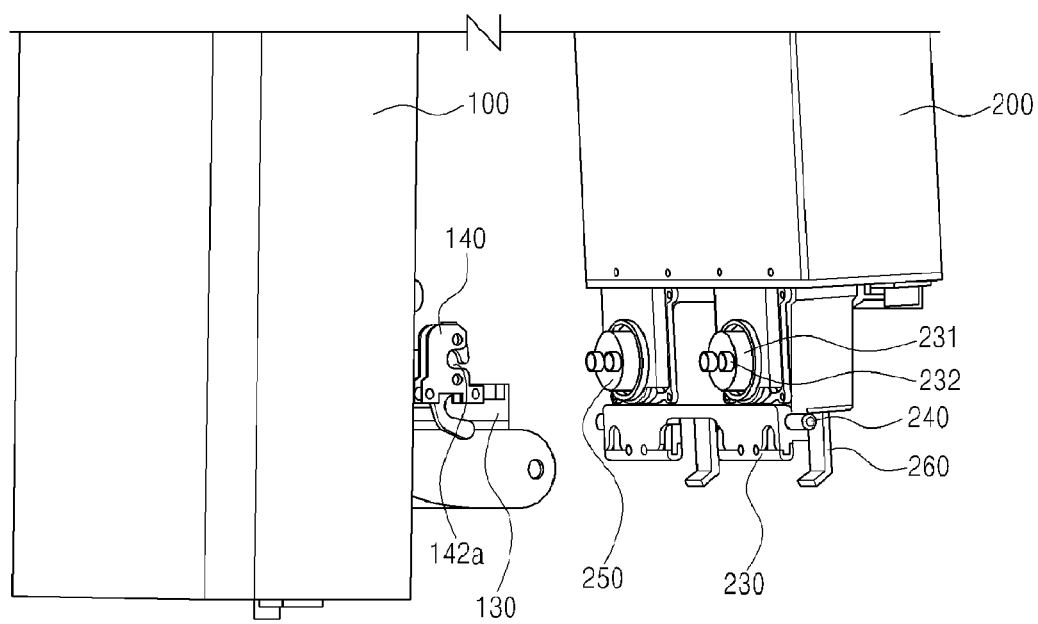
FIG. 7 is a perspective view illustrating a state where a first guide portion and a second sliding portion are separated from each other in an antenna device according to an embodiment of the present disclosure.

FIG. 4 is a perspective view illustrating a first guide portion and a first sliding portion in an antenna device according to an embodiment of the present disclosure. FIG. 5 is a perspective view illustrating a second guide portion and a second sliding portion in an antenna device according to an embodiment of the present disclosure, and FIG. 6 is a perspective view illustrating a second guide portion in an antenna device according to an embodiment of the present disclosure. FIG. 7 is a perspective view illustrating a state where a first guide portion and a second sliding portion are separated from each other in an antenna device according to an embodiment of the present disclosure.

Referring to FIGS. 4 to 7, the detailed configurations of the guide members 120 and 130 and the sliding members 220 and 230 as described above will be described during description of the configurations of guide modules 120, 130, 220, and 230 to be described later.

The guide modules 120, 130, 220, and 230 are configured to be provided to the antenna module 100 and the RRH 200 so that the RRH 200 can be attached to or detached from the antenna module 100. The guide modules 120, 130, 220, and 230 may be provided to guide the RRH 200 so that the RRH 200 slidably moves in the inclined state on the antenna module 100, to cause one end portion of the RRH 200 to be rotatably seated, and to cause the other end portion of the RRH 200 to be movably seated in a direction that is vertical to the sliding movement direction.

The guide modules 120, 130, 220, and 230 may include the guide members 120 and 130 and the sliding members 220 and 230.

The guide modules 120, 130, 220, and 230 are provided on the antenna module 100 and the RRH 200 to guide and support the RRH 200, specifically, one end portion of the RRH 200, so as to perform sliding movement and rotating movement in the first direction X on the side of the antenna module 100 and to guide and support the other end portion of the RRH 200 so as to perform sliding movement in the first direction X and in the second direction Y on the side of the antenna module 100.

In the case of fixing the RRH 200 to the rear surface of the antenna module 100, the guide modules 120, 130, 220, and 230 primarily guide the RRH 200 to slidably move in an inclined state against the rear surface of the antenna module 100. Further, the guide modules 120, 130, 220, and 230 secondarily guide the RRH 200 to face the antenna module 100 in parallel to the antenna module 100, or guide the other end portion of the RRH 200 that faces the antenna module 100 in parallel to the antenna module 100 to slidably move in the second direction Y in an inclined state about the one end portion of the RRH 200 as the rotation axis.

If the RRH 200 is primarily guided in the first direction X in the inclined state on the antenna module 100, the one end portion of the RRH 200 slidably moves in the first direction X on the upper portion of the antenna module 100, and the other end portion of the RRH 200 slidably moves in the first direction X in a position in which the other end portion of the RRH 200 crosses the one end portion of the RRH 200 (the end portions are not in parallel in the gravity direction). As the RRH 200 primarily moves on the antenna module 100, the one end portion of the RRH 200 is positioned adjacent to the antenna module 100, and relatively, the other end portion of the RRH 200 is positioned spaced apart from the antenna module 100. If the other end portion of the RRH 200 that is spaced apart for a predetermined distance from the antenna module 100 is pushed toward the antenna module 100 against the one end portion of the RRH 200 (secondary movement), the inclined RRH 200 on the antenna module 100 is positioned in parallel to the antenna module 100, specifically, in the gravity direction, and the RRH 200 comes in close contact with and is fixed to the rear surface of the antenna module 100.

As described above, the guide modules 120, 130, 220, and 230 may include the guide members 120 and 130 and the sliding members 220 and 230.

The guide members 120 and 130 may be provided on the upper and lower portions of the rear surface of the antenna module 100. The guide members 120 and 130 may be provided to make the movements of the one end portion and the other end portion of the RRH 200 that are seated on the upper portion and the lower portion of the antenna module 100 different from each other during the primary movement and the secondary movement. Specifically, the guide modules 120, 130, 220, and 230 that are provided on the upper portions of the antenna module 100 and the RRH 200 may be guided and supported to slidably move and to rotatably move in the first direction X, and the guide modules 120, 130, 220, and 230 that are provided on the lower portions of the antenna module 100 and the RRH 200 may be guided and supported to slidably move in the second direction Y in accordance with the sliding movement in the first direction X and the pushing and pulling of the other end portion of the RRH 200.

The guide members 120 and 130 may include the first guide portion 120 and the second guide portion 130. The first guide portion 120 and the second guide portion 130 may be provided between fixing modules 101 on the rear surface of the antenna module 100, and in an embodiment of the present disclosure, it is exemplified that the first guide portion 120 and the second guide portion 130 are provided on the side of the fixing modules 101.

The first guide portion 120 may be provided to project from the upper portion of the rear surface of the antenna module 100 toward the outer wall. The first guide portion 120 may be coupled to the one end portion of the RRH 200 to make the one end portion of the RRH 200 slidably move or to rotatably support the one end portion of the RRH 200 in accordance with the primary movement and the secondary movement. In an embodiment of the present disclosure, the first guide portion 120 may be provided with an upper end rail portion that is provided on the fixing module (hereinafter referred to as "upper end fixing portion") 101 that is provided on the upper portion of the rear surface of the antenna module 100, and has a circular hollow portion 121 in a sliding movement direction and an open lower portion along the hollow portion 121 so that the first sliding portion 220 can move through the lower portion. Although not illustrated, the upper end rail portion may be further provided with a first stopper that can limit the sliding movement of the first sliding portion 220 in the first direction X.

The second guide portion 130 is provided on the lower portion of the antenna module 100, and is coupled to the other end portion of the RRH 200 to guide and support the sliding movement of the other end portion of the RRH 200. Further, the other end portion of the RRH 200 slidably moves in the first direction X and the second direction Y on the second guide portion 130, and in the case where the other end portion of the RRH 200 slidably moves in the second direction Y on the second guide portion 130, it may move about the one end portion of the RRH 200 as a rotation axis. If the other end portion of the RRH 200 slidably moves in the second direction Y along the second guide portion 130, the RRH 200 moves in a direction in which the RRH 200 gets adjacent to or goes away from the antenna module 100.

The second guide portion 130 may be provided with a lower end rail portion that has a wide plate shape against the first guide portion 120. The lower end rail portion may include a first-direction guide groove 131*a* provided in a sliding movement direction to guide the sliding movement of the second sliding portion 230 to be described later in the first direction X and in the second direction Y to the upper surface of the plate-shaped second guide portion 130, and a second-direction guide groove 131*b* provided in a vertical direction to the sliding movement direction. In an embodiment of the present disclosure, it is exemplified that the lower end rail portion includes the first-direction guide groove 131*a* and the second-direction guide groove 131*b* that are formed thereon, but is not limited thereto. For example, the lower end rail portion may be changed or modified without limit so far as it has a structure or a configuration that guides the movement of the second sliding portion 230 to be described later in the first direction X and in the second direction Y.

Each end portion of the first-direction guide groove 131*a* and the second-direction guide groove 131*b* may serve as a stopper for stopping the sliding movement of the second sliding portion 230 in the first direction X and in the second direction Y.

The sliding members 220 and 230 may be provided on the RRH 200, specifically, on one surface of the RRH 200 that faces the antenna module 100. The sliding members 220 and 230 are seated on the guide members 120 and 130 that are formed to project from the rear surface of the antenna module 100, that is, on the first guide portion 120 and the second guide portion 130 as described above. If the sliding members 220 and 230 are seated on the guide members 120 and 130 and slidably move in the first direction X along the guide members 120 and 130, the RRH 200 may slidably move in an inclined state on the antenna module 100 that is mounted in the gravity direction. Further, if the sliding members 220 and 230 move in the second direction Y on the guide members 120 and 130, the RRH 200 is provided in an inclined state or in parallel to the antenna module 100.

The sliding members 220 and 230 may include the first sliding portion 220 and the second sliding portion 230.

The first sliding portion 220 is provided on the upper portion of the RRH 200, and is seated on the first guide portion 120 to slidably move along the first guide portion 120 or to be rotated on the first guide modules 120, 130, 220, and 230. The first sliding portion 220 may be provided as an upper end slider that is provided in the form of a circular bar that is formed long in the sliding movement direction. The upper end slider may be inserted into the upper end rail portion that has the shape of a hollow portion 121 as described above and may slidably move in the first direction X along the upper end rail portion. Further, outer and inner surfaces of the upper end slider and the upper end rail portion may be circularly engaged with each other, and the upper end slider may be rotatably provided on the upper end rail portion.

The second sliding portion 230 is provided on the lower portion of the RRH 200, and is seated on the second guide portion 130 to slidably move along the second guide portion 130 or to move in a vertical direction to the sliding movement direction. The second sliding portion 230 may be provided as a lower slider that is formed to project from at least one of the lower portion of the RRH 200 and lower portions of the connection modules 150 and 250. In an embodiment of the present disclosure, it is exemplified that the lower slider projects to the lower portions of the connection modules 150 and 250 that are formed to project from the lower portion of the RRH 200. However, the position of the lower slider is not limited thereto. In an embodiment of the present disclosure, the connection modules 150 and 250, specifically, the second connection portion 250 is formed to project from the lower portion of the RRH 200, and the lower slider is formed to project to the lower portions of the connection modules 150 and 250. Unlike this, the connection modules 150 and 250 may be positioned on one surface of the RRH 200 that faces the antenna module 100. In this case, the lower slider may be formed to project from the lower portion of the RRH 200. As described above, the mount position of the lower slider may be variable without limit in accordance with the shape, structure, or configuration of the RRH 200. The lower slider is seated and supported on the second guide portion 130, and moves in the first direction X along the first-direction guide groove 131*a* that is formed on the second guide portion 130 and in the second direction Y along the second-direction guide groove 131*b*.

In the antenna device 10, coupling modules 140 and 240 may be provided to fix the RRH 200 to the antenna module 100 and to stably maintain the electrical connection state of the connection modules 150 and 250 to be described later in the case where the other end portion of the RRH 200 is pushed toward the rear surface of the antenna module 100 and the RRH 200 becomes in parallel to the antenna module 100. The coupling modules 140 and 240 may respectively provided on the antenna module 100 and the RRH 200 so as to fix the antenna module 100 and the RRH 200 that are positioned in parallel to each other. Specifically, the coupling modules 140 and 240 may include a fixing member 140 and a locking member 240.

The fixing member 140 is provided on both end portions of the second guide portion 130, and in the fixing member 140 for the RRH 200 according to an embodiment of the present disclosure, a locking plate having a hook-shaped opening may be elastically and rotatably provided between support plates. If the locking member 240 to be described later is seated on the hook-shaped locking plate, the locking plate is elastically and automatically rotated between the support plates to be engaged with and fixed to the locking member 240.

The locking member 240 is formed to extend in both side directions from both end portions of the second sliding portion 230. The locking member 240 may be composed of a locking projection so as to be inserted into the hook-shaped opening as described above. If the other end portion of the RRH 200 is pushed to be close to the antenna module 100, the locking member 240 that is the locking projection may be drawn toward the opening of the locking plate.

That is, if the locking projection is drawn toward the opening of the locking plate, the locking plate is automatically rotated by an elastic body or the like between the support plates. As the locking plate is rotated, the opening moves between the support plates, and the locking projection is locked in the hook-shaped opening to make the locking member 240 locked in the locking plate. Accordingly, the RRH 200 is maintained in a coupling state on the rear surface of the antenna module 100. Further, if the locking plate is rotated between the support plates in a state where the locking projection is locked in the hook-shaped opening, the opening may be opened on the support plates. If a worker holds the locking member 240 and pulls the RRH 200, the locking member 240 secedes from the locking plate to release the locking, and the RRH 200 is positioned in an inclined state on the antenna module 100 to slidably move in the first direction X.

Figure 8:
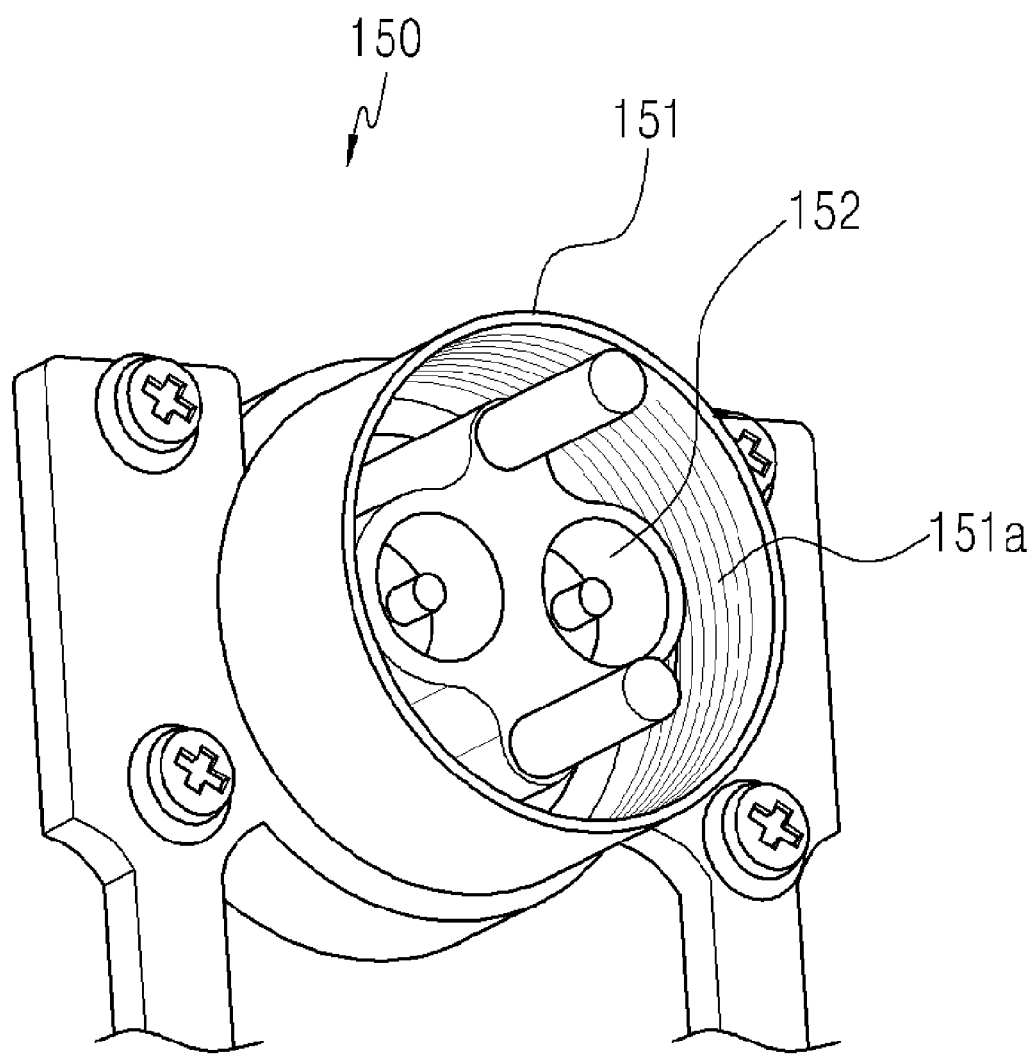
FIG. 8 is a view illustrating a first connection portion in an antenna device according to an embodiment of the present disclosure.

FIG. 8 is a view illustrating a first connection portion in an antenna device according to an embodiment of the present disclosure.

Referring to FIG. 8 (hereinafter, also referring to FIGS. 1 to 7), on surfaces on which the antenna module 100 and the RRH 200 face each other, specifically, in directions of the rear surface of the antenna module 100 and the front surface of the RRH 200, connection modules 150 and 250 for electrically connecting the antenna module 100 and the RRH 200 are provided. The connection modules 150 and 250 may include a first connection portion 150 and a second connection portion 250.

The first connection portion 150 is provided to be drawn from the rear surface of the antenna module 100 toward the inside, and the second connection portion 250 is formed to project from the RRH 200 and is drawn toward the first connection portion 150 to come in close contact with the first connection portion 150. If the other end portion of the RRH 200 moves in the second direction Y in which the other end portion of the RRH 200 gets near to or goes away from the antenna module 100, the second connection portion 250 may be drawn into and engaged with the first connection portion 150 or may be drawn out and secede from the first connection portion 150. The second connection portion 250 moves straight to the first connection portion 150 to be electrically connected to each other through the driving of the coupling modules 140 and 240 to be described later in a state where the second connection portion 250 comes in close contact with the first connection portion 150.

The first connection portion 150 may include a first terminal portion 152 and a first housing 151. The first housing 151 may be provided around the first terminal portion 152 that is provided to be drawn into the inside of the rear surface of the antenna module 100. A second housing 251 of the second connection portion 250 to be described later may be drawn into the first housing 151 to be blind-mated.

Screw threads may be formed on the circumferential surface of the first housing 151 to correspond to a movement portion of the coupling modules 140 and 240 to be described later. The screw threads are engaged with the movement portion, specifically, a screw pattern, that is formed on the inner surface of the second housing 251 of the second connection portion 250, and are rotated to make the second terminal portion 252 of the second connection portion 250 move straight in the second direction Y.

The first terminal portion 152 is formed to project from the inside of the rear surface of the antenna module 100. The first terminal portion 152 may be elastically mounted on the first housing 151. If the other end portion of the RRH 200 that is guided and moved to the antenna module 100 in an inclined state is pushed toward the antenna module 100, the first terminal portion 152 may be elastically driven and stably engaged with the second terminal portion 252 of the second connection portion to be described later.

The second connection portion 250 may include the second terminal portion 252 and the second housing 251.

In an embodiment of the present disclosure, the second housing 251 is provided in a direction in which the second housing 251 faces the antenna module 100, and is formed to project to the lower portion of the RRH 200. The second housing 251 is provided around the second terminal portion 252, and the second housing 251 is provided to be drawn into, to come in close contact with, and to be seated on the first housing 151. Further, the second housing 251 is drawn into the first housing 151, and the first terminal portion 152 and the second terminal portion 252 are provided to be engaged with each other in an airtight state in the first and second housings 151 and 251. On an outside of the second housing 251, a screw pattern that can be engaged with and coupled to the screw threads that are formed on the inner surface of the first housing 151 is formed. The second housing 251 moves straight in the second direction Y as being rotated along the screw threads of the inner surface of the first housing 151 in accordance with the driving of the coupling modules 140 and 240 to be described later. Further, as the second housing 251 is rotated in a state where the second terminal portion 252 is engaged with the first terminal portion 152, the second terminal portion 252 moves straight along the second direction Y to be electrically coupled to or decoupled from the first terminal portion 152.

For example, in a state where the first terminal portion 152 and the second terminal portion 252 are engaged with each other, the electrical coupling is performed as follows. First, the RRH 200, which moves in the first direction X in the antenna module 100, is rotated and moves in the second direction Y to come in close contact with the rear surface of the antenna module 100. If the RRH 200 comes in close contact with the rear surface of the antenna module 100, the second housing 251 is drawn into the first housing 151, and the first terminal portion 152 and the second terminal portion 252 are engaged with each other. In this case, the first terminal portion 152 and the second terminal portion 252 are engaged with each other, but are in a state before they are electrically coupled to each other. In this state, if the coupling modules 140 and 240 that are provided in the second connection portion 250 to be described later are driven, the second terminal portion 252 moves straight toward the first terminal portion 152 to be electrically coupled to each other.

As described above, the coupling modules 140 and 240 are provided to drive the first and second terminal portions 152 and 252 that are only engaged with each other in accordance with the close contact of the RRH 200 with the antenna module 100 so that the first and second terminal portions 152 and 252 are electrically coupled to or decoupled from each other (See FIGS. 1, 2, 3, and 5).

That is, if the RRH 200 is arranged in parallel to the rear surface of the antenna module 100, the first terminal portion 152 and the second terminal portion 252 are not exposed to an outside in a state where they are surrounded by the first housing 151 and the second housing 251 in accordance with the close contact of the first housing 151 with the second housing 251. Further, if the RRH 200 moves to be positioned in parallel to the antenna module 100, the first terminal portion 152 and the second terminal portion 252 are engaged with each other, but are not electrically coupled to each other. Accordingly, the coupling modules 140 and 240 are driven to make the second terminal portion 252 that is blinded as being surrounded by the first housing 151 and the second housing 251 move straight toward the first terminal portion 152 so that the second terminal portion 252 is coupled to or decoupled from the first terminal portion 152.

The coupling modules 140 and 240 are provided on the rear surface of the RRH 200, specifically, on the rear surface of the second connection portion 250, so that a worker can electrically connect the RRH 200 to the antenna module 100 without any separate tool. The coupling modules 140 and 240 may include a lever portion 260 that drives the second terminal portion 252 to move straight toward the first terminal portion 152, and a movement portion that the second terminal portion 252 moves toward the first terminal portion 152.

The lever portion 260 may be provided to be rotatable on the rear surface of the second connection portion 250 and to be seated in the opening that is provided on the rear surface of the second connection portion 250. The lever portion 260 may be seated in the opening that is formed on the second connection portion 250 and may be positioned to face the surface of the second connection portion 250. The lever portion 260 may be provided to move for a first rotation so as to project in a vertical direction to the surface of the second connection portion 250 about one end that is rotatably coupled to the second connection portion 250 as a center axis, and the lever portion 260 that projects from the surface of the second connection portion 250 may be provided to move for a second rotation about the center axis. If the lever portion 260 moves for the first rotation on the second connection portion 250, the lever portion 260 is positioned in parallel to the surface of the second connection portion 250, and is seated in or secedes from the opening to project in the vertical direction to the surface of the second connection portion 250. If the lever portion 260 that projects from the second connection portion 250 moves for the second rotation around the one end thereof, the movement portion to be described later is rotated to guide the straight movement of the second terminal portion 252.

The movement portion is provided on the second connection portion 250, and makes the second housing 251 be rotated or move straight in accordance with the rotation of the lever portion 260. The movement portion may be provided as a screw pattern that is formed on an outer surface of the second housing 251, and the second housing 251 may be provided to move in a straight direction on the second connection portion 250 in accordance with the driving of the lever portion 260.

The coupling modules 140 and 240 may be driven in two modes that are a locking mode and a driving mode. The locking mode corresponds to a state where the driving of the second connection portion 250 is limited. If the lever portion 260 is seated in the opening of the rear surface of the second connection portion 250, the driving of the lever portion 260 is limited, and the driving of the second connection portion 250 is locked.

In this state, if the lever portion 260 is made to secede from the opening and to move vertically to the surface of the second connection portion 250, the coupling modules 140 and 240 are switched from a locking mode to a driving mode. In the driving mode, the lever portion 260 that projects in the vertical direction from the second connection portion 250 becomes rotatable, and as the lever portion 260 is rotated clockwise or counterclockwise, the second connection portion 250, specifically, the second housing 251 and the second terminal portion 252, moves in a straight direction.

Figure 9:
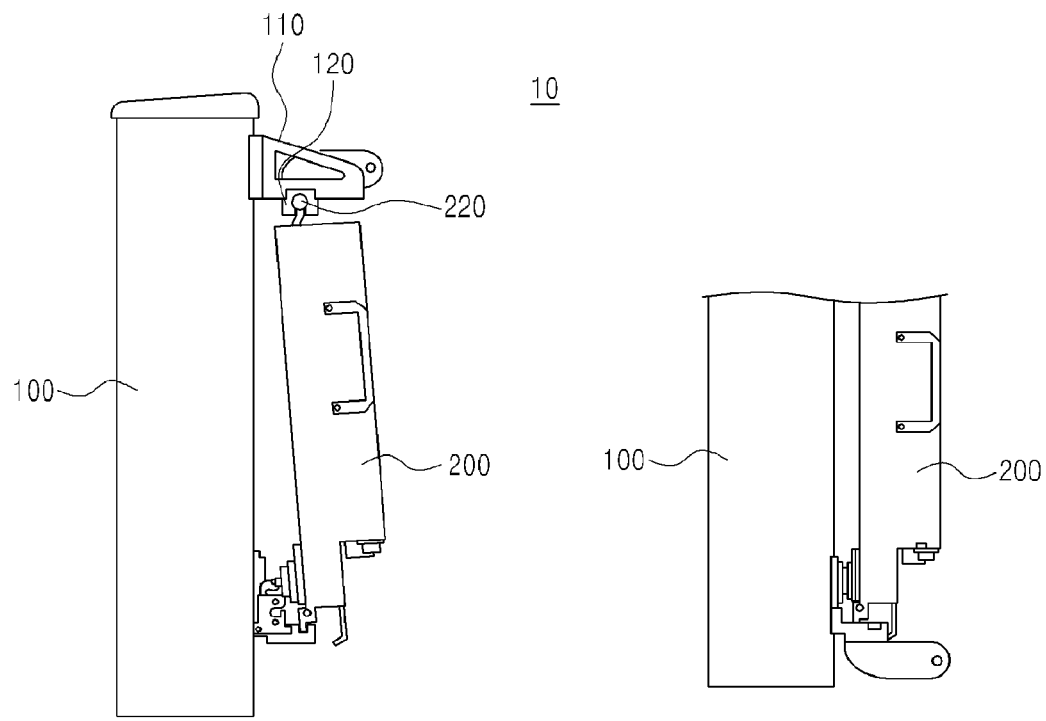
FIG. 9 is a view explaining a process in which an RRH is attached to or detached from an antenna module in an antenna device according to an embodiment of the present disclosure.

FIG. 9 is a view explaining a process in which an RRH is attached to or detached from an antenna module in an antenna device according to an embodiment of the present disclosure.

Referring to FIG. 9, a process in which the RRH 200 is attached to or detached from the antenna module 100 in a state where the antenna device 10 is supported on an outer wall will be described. The antenna module 100 is fixed to the outer wall. That is, an upper portion of the antenna module 100 is supported on the outer wall by an upper fixing module 101, and a lower portion of the antenna module 100 is supported on the outer wall by a lower fixing module 101. If the antenna module 100 is fixed to the outer wall, a space in which the RRH 200 is to be mounted is formed between the antenna module 100 and the outer wall.

Between the fixing modules 101, the first guide portion 120 and the second guide portion 130 are provided to project from the rear surface of the antenna module 100 so that they face each other in upper and lower directions. Since the size of the second guide portion 130 is larger than the size of the first guide portion 120, a space that is as much as the size of the second guide portion 130 should be formed between the antenna module 100 and the outer wall.

The RRH 200 is seated in an inclined state on the rear surface of the antenna module 100, and slidably moves along the first direction X in the inclined state. Specifically, on the first guide portion 120 that is provided on an upper portion of the rear surface of the antenna module 100, specifically, on a front end rail portion 120 having a hollow portion 121 that is opened in the lower direction, an upper slider that is provided on one end portion of the RRH 200 is seated. Further, on the second guide portion 130 that is provided on a lower portion of the rear surface of the antenna module 100, specifically, on a first-direction guide groove 131a that is provided on a lower end rail portion, a lower slider that is provided on the other end portion of the RRH 200 is seated. Since the upper end rail portion is positioned adjacent to the antenna module 100 against the first-direction guide groove 131a, one end portion of the RRH 200 is positioned close to the antenna module 100, and the other end portion of the RRH 200 is positioned to be spaced apart for a predetermined distance from the antenna module 100 relative to the one end portion of the RRH 200. Accordingly, if the first sliding portion 220 and the second sliding portion 230 are seated on the first guide portion 120 and the second guide portion 130, the RRH 200 is seated in the inclined state on the antenna module 100, and slidably moves in the first direction X in the inclined state (see FIG. 9).

If the RRH 200 that has moved in the first direction X in the inclined state on the antenna module 100 is positioned on the rear surface of the antenna module 100, the first connection portion 150 and the second connection portion 250 are positioned to face each other in a state where they are spaced apart from each other. If a worker pushes the other end portion of the RRH 200, the second sliding portion 230 slidably moves in the second direction Y from the second guide portion 130 about the first sliding portion 220 that is coupled to the first guide portion 120 as a rotation axis. That is, the lower slider slidably moves in the second direction Y along the second-direction guide groove 131b.

If the other end portion of the RRH 200 is pushed to move toward the antenna module 100, the locking member 240 that is formed to project from both end portions of the second sliding portion 230 is locked in the opening of the locking plate that is mounted on both sides of the second guide member 130, and the locking plate is elastically rotated on the support plates to be drawn between the support plates, so that the locking member 240 is locked in a state where it is seated in the opening. Accordingly, the RRH 200 can be stably coupled to the rear surface of the antenna module 100.

The first connection portion 150 and the second connection portion 250 have a blind mating structure. If the RRH 200 is locked in and fixed to the antenna module 100, the second housing 251 is seated on the first housing 151, and the second terminal portion 252 and the first terminal portion 152 are engaged with each other. The first terminal portion 152 and the second terminal portion 252 are engaged with each other, but are not electrically connected to each other. Accordingly, by rotating the lever portion 260 that is seated in the opening of the rear surface of the second connection portion 250 to be in a locking mode so that the lever portion 260 projects in a vertical direction to the surface of the second connection portion 250, the coupling modules 140 and 240 are switched to a driving mode.

If the lever portion 260 that projects from the second connection portion 250 is rotated clockwise or counterclockwise, the second housing 251 that is provided with the second terminal portion 252 is rotated and moves straight, and the second terminal portion 252 moves straight toward the first terminal portion 152. Accordingly, the first terminal portion 152 and the second terminal portion 252 may be electrically coupled to each other. If the lever portion 260 is seated again in the opening of the second connection portion 250 after the second connection portion 250 is driven, the coupling modules 140 and 240 are switched to the locking mode, and the RRH 200 is maintained in a state where it is coupled to the antenna module 100. As described above, the RRH 200 is detachably provided on the antenna module 100, and can be electrically coupled to the antenna module 100 without any separate tool.

Further, the RRH 200 that has been coupled to the antenna module 100 is separated from the antenna module 100 as follows. On the contrary to the coupling of the RRH 200 to the antenna module 100, the coupling modules 140 and 240 are first switched from a locking mode to a driving mode. That is, the lever portion 260 secedes from the opening, and the lever portion 260 that projects from the second connection portion 250 is rotated clockwise or counterclockwise to drive the second connection portion 250 in a direction in which the second connection portion 250 goes away from the first connection portion 150. Accordingly, the electrical coupling of the second terminal portion 252 and the first terminal portion 152 is disconnected, and the second housing 251 is maintained only in a state where the second housing 251 is seated on the first housing 151. If the locking plate is operated in this state, the locking plate is rotated between the support plates, and the opening that is drawn into the support plates is exposed to an outside. If the locking member 240 that is locked in the opening that is exposed to the outside is pulled and the other end portion of the RRH 200 is pulled, the lower slider moves in a direction in which the lower slider goes away from the antenna module 100 along the second-direction guide groove 131b, and then the lower slider moves to the first-direction guide groove 131a. If a worker slidably moves the RRH 200 in the first direction X from the antenna module 100, the RRH 200 may slidably move in the inclined state on the antenna module 100 to secede from the antenna module 100.

As described above, even in the case where the RRH 200 secedes from the antenna module 100, a separate tool is not needed. Accordingly, worker's convenience is increased, and a safety accident that is caused by a separate attachment/detachment tool or the like can be prevented from occurring.

Hereinafter, referring to FIGS. 10 to 15, an antenna device 10 according to a second embodiment of the present disclosure will be described. In explaining the antenna device 10 according to the second embodiment, the above description may be preferentially applied with respect to the same configuration or operation as that of the antenna device 10 as described above.

Figure 10:
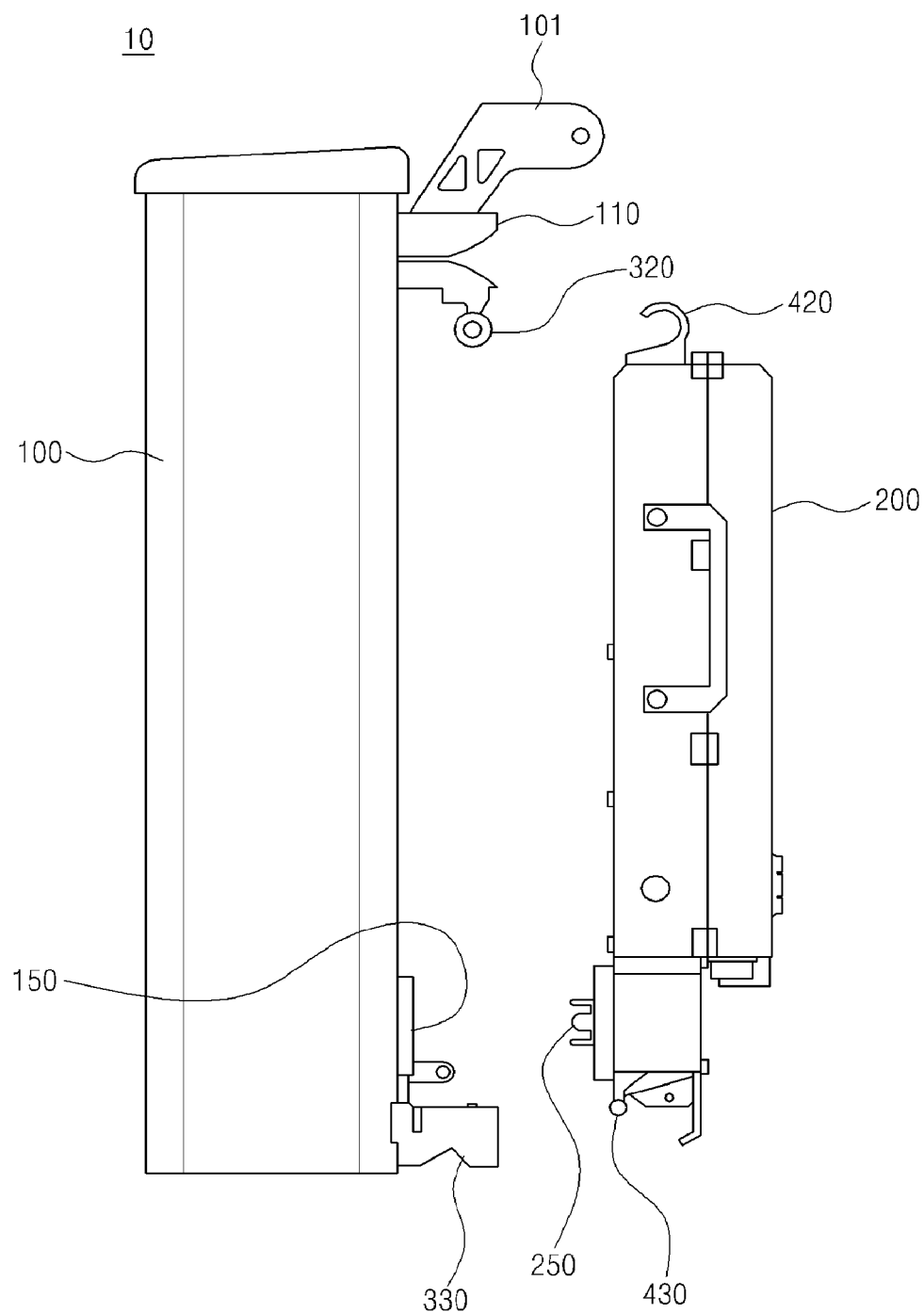
FIG. 10 is a side view illustrating a state where an antenna module and an RRH are separated from each other in an antenna device according to one of various embodiments of the present disclosure.
Figure 11:
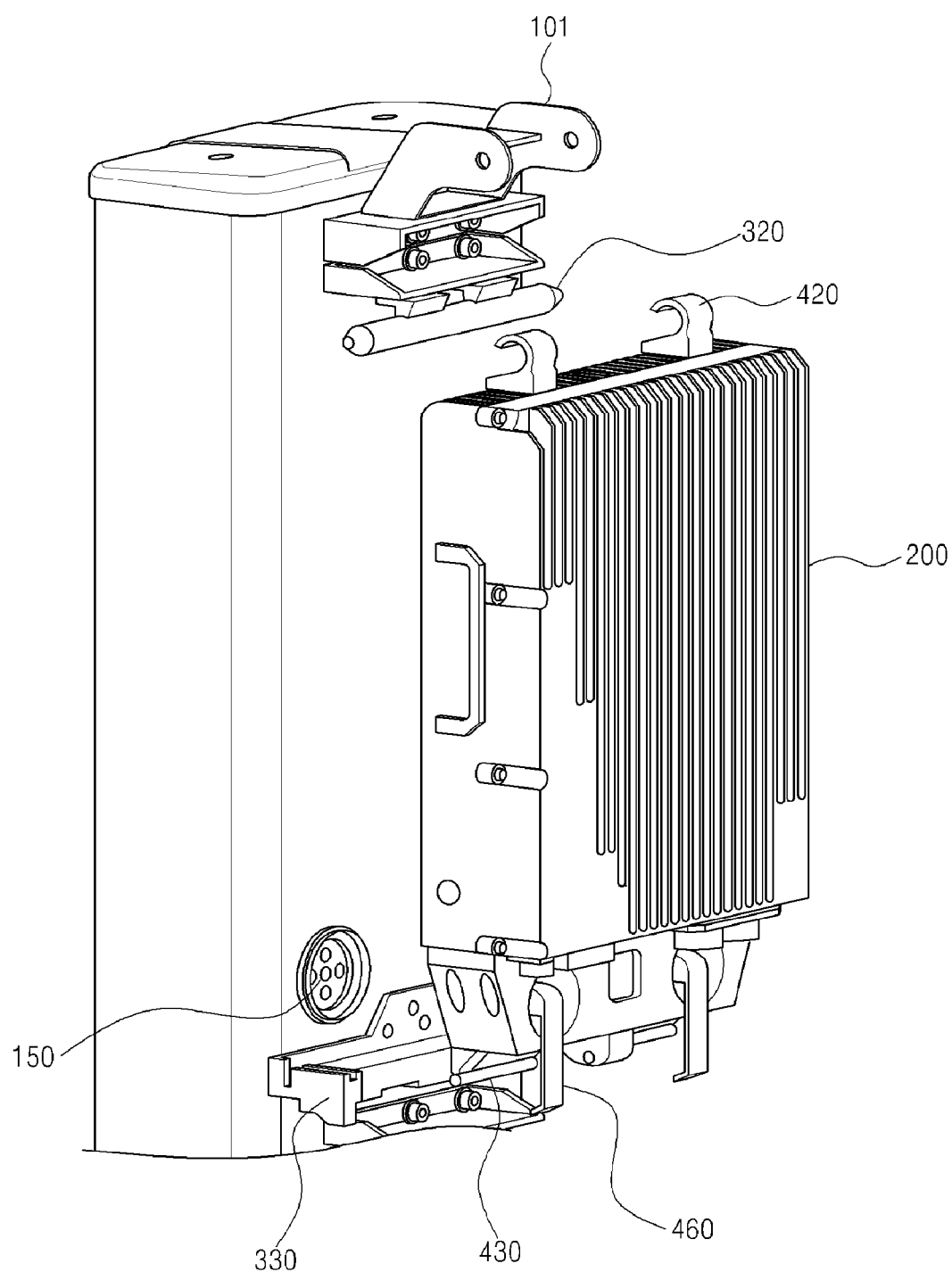
FIG. 11 is a rear-side perspective view illustrating a state where an antenna module and an RRH are separated from each other in an antenna device according to one of various embodiments of the present disclosure.

FIG. 10 is a side view illustrating a state where an antenna module 100 and an RRH 200 are separated from each other in an antenna device 10 according to one of various embodiments of the present disclosure, and FIG. 11 is a rear-side perspective view illustrating a state where an antenna module 100 and an RRH 200 are separated from each other in an antenna device 10 according to one of various embodiments of the present disclosure.

Referring to FIGS. 10 and 11, an antenna device 10 according to one of various embodiments of the present disclosure may include an antenna module 100, an RRH 200, attachment/detachment members 320, 420, 330, and 430, connection modules 150 and 250, and coupling modules 140 and 240.

The antenna device 10 according to an embodiment of the present disclosure is different from the antenna device 10 as described above on the point of the structure for mounting the RRH 200 on the antenna module 100. That is, the RRH 200 as described above has a structure in which the RRH 200 slidably moves in the form of a slant line in a direction that is measured from one side to the other side of the antenna module 100, and then is coupled to the antenna module 100 through pushing of the lower portion of the RRH 200 toward the antenna module 100.

In contrast, the RRH 200 according to an embodiment of the present disclosure has a structure in which the RRH 200 is seated in a slant line direction on the rear surface of the antenna module 100, and then is coupled to the antenna module 100 through the pushing operation.

Specifically, the attachment/detachment members 320, 420, 330, and 430 may be provided on upper and lower portions of the antenna module 100 and the RRH 200 so that the RRH 200 is attached to or detached from one surface of the antenna module 100. Such attachment/detachment members 320, 420, 330, and 430 may be provided as guide modules configured to cause one end portion of the RRH 200 to be locked and rotatably seated, to guide the other end portion of the RRH 200 to move in a direction in which the other end portion of the RRH 200 gets near to or goes away from the antenna module 100 in accordance with the rotation of the RRH 200, and to cause the other end portion of the RRH 200 to be seated.

In an embodiment of the present disclosure, the guide module may include a locking bar member 320, a hook member 420, a lower end rail portion 330, and a lower slider 430. The locking bar member 320 and the hook member 420 may be positioned on upper portions of the antenna module 100 and the RRH 200, and the lower end rail portion 330 and the lower slider 430 may be positioned on lower portions of the antenna module 100 and the RRH 200.

Figure 12:
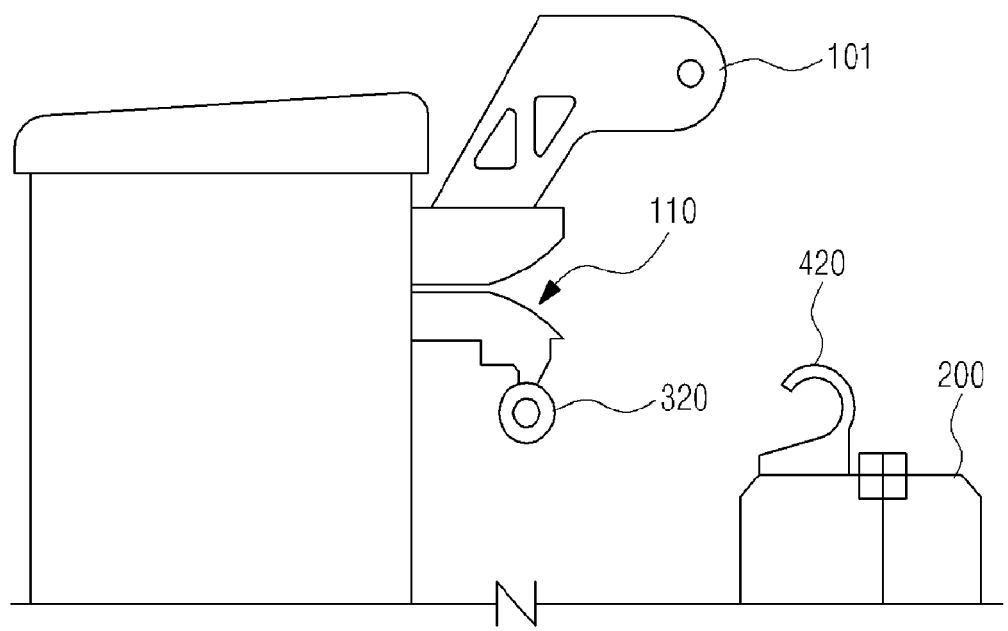
FIG. 12 is an enlarged view illustrating a locking bar member and a hook member of an antenna device according to one of various embodiments of the present disclosure.
Figure 13:
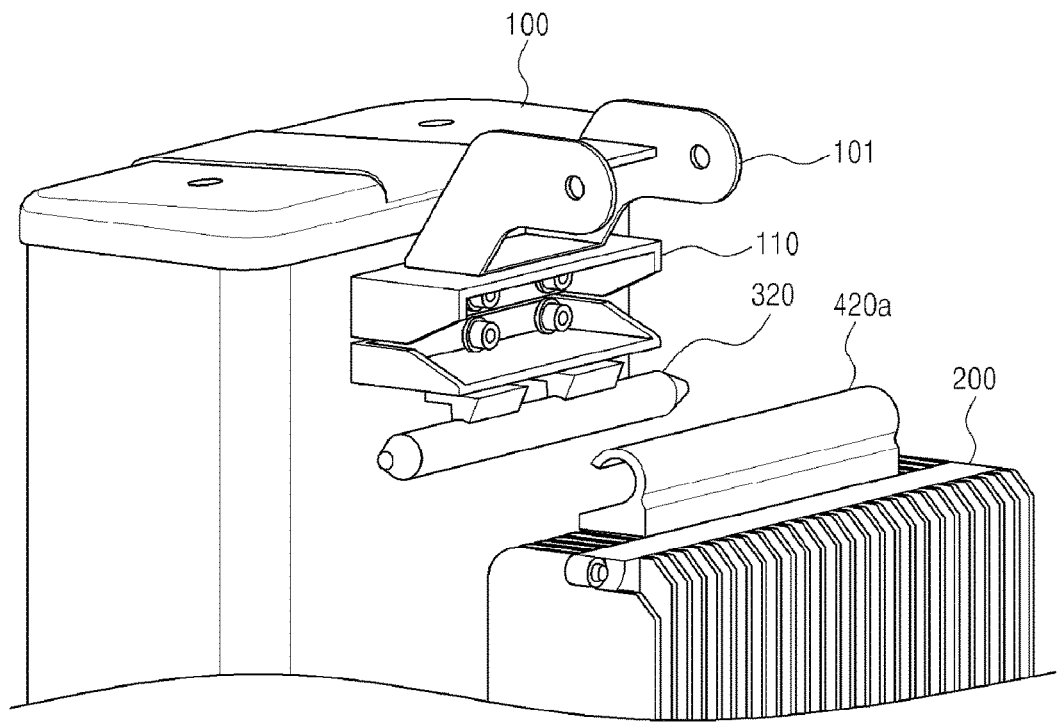
FIG. 13 is a view illustrating another shape of a hook member of an antenna device according to one of various embodiments of the present disclosure.

FIG. 12 is an enlarged view illustrating a locking bar member 320 and a hook member 420 of an antenna device 10 according to one of various embodiments of the present disclosure, and FIG. 13 is a view illustrating another shape of a hook member 420 of an antenna device 10 according to one of various embodiments of the present disclosure.

Referring to FIGS. 12 and 13, at least one locking bar member 320 is provided on an upper side of the rear surface of the antenna module 100. The locking bar member 320 may have a long and round shape, and may be provided in a direction in which the locking bar member is in parallel to the rear surface of the antenna module 100. The hook member 420 that is formed on one end portion of the RRH 200 to be described later may be provided to be rotatably locked and seated on the locking bar member 320. In an embodiment of the present disclosure, it is exemplified that the locking bar member 320 is provided together with the fixing module that is provided on the upper portion to support the antenna module 100 on the outer wall. However, so far as the locking bar member 320 is configured to rotatably seat the upper portion of the RRH 200 on the upper side of the rear surface of the antenna module 100, it may be changed or modified without limit. For example, although it is exemplified that the locking bar member 320 is implemented in the shape of a long round bar, two locking bar members 320 may be separately provided.

At least one hook member 420 may be provided on the upper portion of the RRH 200, and may be rotatably locked and seated on the locking bar member 320. The hook member 420 is in the shape of a hook of which one side is opened, and may be rotatably seated on the locking bar member 320 as described above. In an embodiment of the present disclosure, it is exemplified that two hook members 420 are provided on the upper portion of the RRH 200. However, the hook member 420 is not limited thereto, but various modifications or changes of the hook member 420 may be made in a manner that one hook member 420 may be formed long in the first direction X of the RRH 200, or although not illustrated, one hook member 420 may be formed in the center of the RRH 200.

The lower end rail portion 330 may be provided on the lower portion of the antenna module 100, and may be coupled to the other end portion of the RRH 200 to guide and support the other end portion of the RRH 200 to move in a direction in which the other end portion of the RRH 200 gets adjacent to or goes away from the antenna module 100 about the one end portion of the RRH 200 as the rotation axis. The lower end rail portion 330 may include a guide groove in which the lower slider 430 is seated and which guides the lower slider 430 in the direction in which the lower slider 430 gets adjacent to or goes away from the antenna module 100.

The lower slider 430 may be provided on the lower portion of the RRH 200, and may be seated on the lower end rail portion 330 to slidably move along the lower end rail portion 330, specifically, the guide groove, to be attached to or detached from the antenna module 100. The lower slider 430 may be formed to project from at least one of the lower portion of the RRH 200 and the lower portions of the connection modules 150 and 250, and may slidably move along the guide groove.

That is, in a state where the RRH 200 is put in an inclined state on the rear surface of the antenna module 100, the hook member 420 is locked in and seated on the locking bar member 320. If the hook member 420 is locked in the locking bar member 320, the lower slider 430 may be seated at one end of the guide groove in a direction in which the lower slider 430 is far from the antenna module 100. If the lower portion of the RRH 200 is pushed in this state, the lower slider 430 is pushed from the one end of the guide groove to the other end of the guide groove in a direction in which the lower slider is close to the antenna module 100 to slidably move along the guide groove. In this case, the hook member 420 may be rotated around the locking bar member 320 as an axis. If the lower slider 430 moves toward the antenna module 100, the other end portion of the RRH 200 may move in a direction in which it gets near to or goes away from the antenna module 100.

Although not illustrated, like the antenna device 10 according to the first embodiment as described above, the antenna device 10 according to an embodiment of the present disclosure may be provided with the coupling modules 140 and 240 which can fix the RRH 200 to the antenna module 100 and can stably maintain the electrical connection state between the connection modules 150 and 250 (see FIGS. 5 to 8). Since the corresponding configuration has been described in the first embodiment, it may be preferentially applied in this embodiment.

However, the fixing member may be positioned on both end portions of the lower end rail portion 330, or may be positioned in a specific position of the lower portion of the rear surface of the antenna module 100. Further, the locking member may be provided in a position that is adjacent to the lower slider 430, or may be formed to project in the X direction from the specific position of the RRH 200 that corresponds to the fixing member.

Further, as in the first embodiment as described above, if the other end portion of the RRH 200 moves adjacent to the antenna module 100, the first connection portion that is provided on the rear surface of the antenna module 100 may be connected to the second connection portion 250 that is provided on one surface of the RRH 200. Since the corresponding configuration, operation, and attachment/detachment structure are the same as the contents as described above in the first embodiment, they may be preferentially applied in this embodiment (see FIGS. 5 to 8).

That is, if the RRH 200 is arranged in parallel to the rear surface of the antenna module 100, the first terminal portion and the second terminal portion are not exposed to an outside in a state where they are surrounded by the first housing and the second housing in accordance with the close contact between the first housing and the second housing. Further, if the RRH 200 moves to be positioned in parallel to the antenna module 100, the first terminal portion and the second terminal portion are engaged with each other, but are not electrically coupled to each other. Accordingly, the coupling modules 140 and 240 may be driven to make the second terminal portion that is blinded as being surrounded by the first housing and the second housing move straight toward the first terminal portion so that the second terminal portion is coupled to or decoupled from the first terminal portion.

As described above even in the first embodiment, the coupling modules 140 and 240 may be provided on the rear surface of the RRH 200, specifically, on the rear surface of the second connection portion 250, so that a worker can electrically connect the RRH 200 to the antenna module 100 without any separate tool. The coupling modules 140 and 240 may be driven in two modes of a locking mode and a driving mode. The locking mode corresponds to a state where the driving of the second connection portion 250 is limited. If the lever portion is seated in the opening of the rear surface of the second connection portion 250, the driving of the lever portion may be limited, and the driving of the second connection portion 250 may be locked (see FIGS. 5 to 8).

Figure 14:
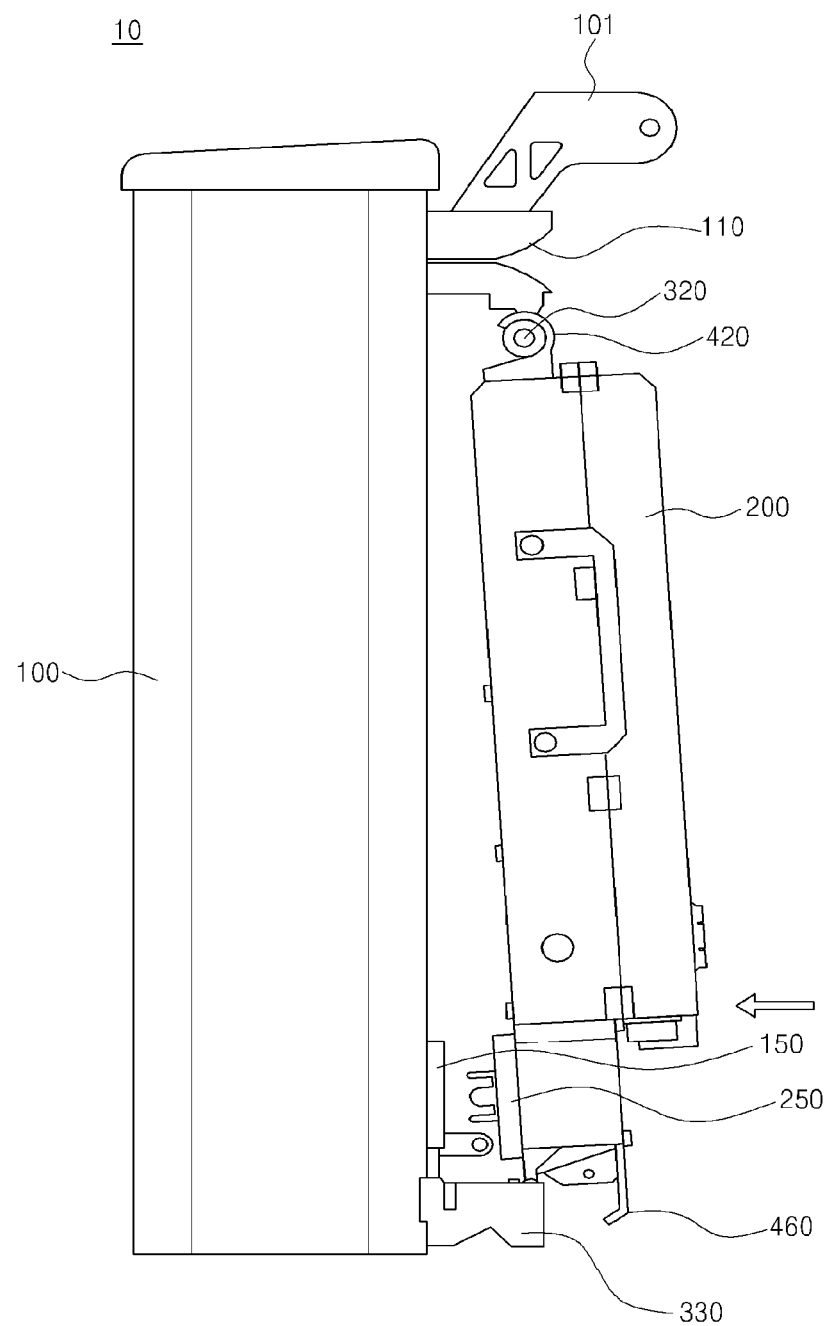
FIG. 14 is a view illustrating a state before an RRH is attached to the rear surface of an antenna module in an antenna device according to one of various embodiments of the present disclosure.
Figure 15:
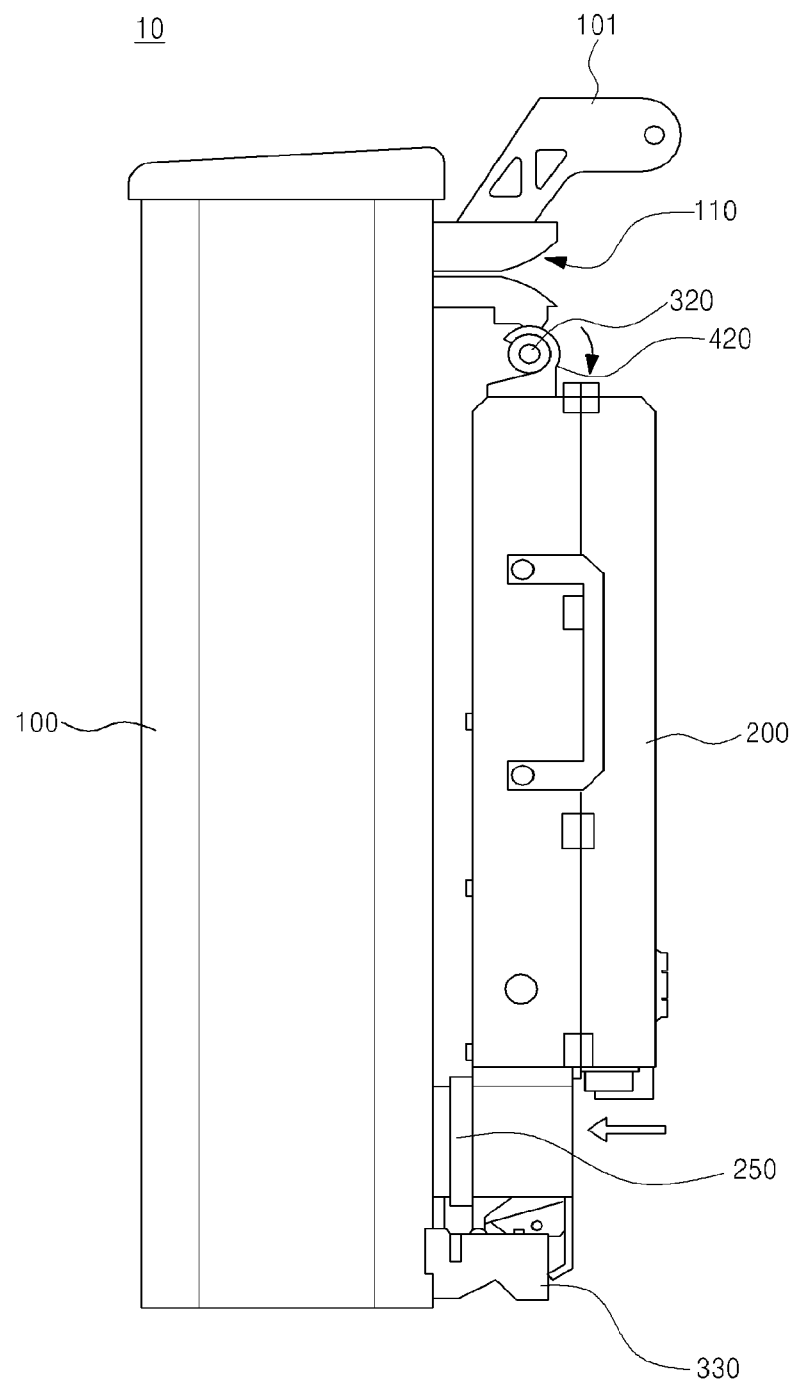
FIG. 15 is a view illustrating a state where an RRH is attached to the rear surface of an antenna module in an antenna device according to one of various embodiments of the present disclosure.

FIG. 14 is a view illustrating a state before an RRH 200 is attached to the rear surface of an antenna module 100 in an antenna device 10 according to one of various embodiments of the present disclosure, and FIG. 15 is a view illustrating a state where an RRH 200 is attached to the rear surface of an antenna module 100 in an antenna device 10 according to one of various embodiments of the present disclosure.

Referring to FIGS. 14 and 15, a process in which the RRH 200 is attached to or detached from the antenna module 100 in a state where the antenna device 10 is supported on an outer wall will be described. The antenna module 100 is fixed to the outer wall. That is, an upper portion of the antenna module 100 is supported on the outer wall by an upper fixing module, and a lower portion of the antenna module 100 is supported on the outer wall by a lower fixing module. If the antenna module 100 is fixed to the outer wall, a space in which the RRH 200 is to be mounted is formed between the antenna module 100 and the outer wall.

On the rear surface of the antenna module 100, the locking bar member 320 and the lower end rail portion 330 are provided to project and to face each other. The RRH 200 may be positioned in an inclined state on the rear surface of the antenna module 100. Specifically, on the locking bar member 320 that is provided on the upper portion of the rear surface of the antenna module 100, the upper end rail portion having a hollow portion that is opened in one direction may be locked in and seated. Further, the lower slider 430 that is provided on the other end portion of the RRH 200 is seated in the guide groove that is formed between the lower end rail portions 330 that are provided on the lower portion of the rear surface of the antenna module 100. The RRH 200 is seated in an inclined state on the rear surface of the antenna module 100, and slidably moves in the second direction Y in the inclined state.

If the RRH 200 is positioned on the rear surface of the antenna module 100, the first connection portion 150 and the second connection portion 250 are positioned to face each other in a state where they are spaced apart from each other. If a worker pushes the other end portion of the RRH 200, the lower slider 430 slidably moves in the second direction Y along the guide groove of the lower end rail portion 330 about the locking bar member 320 and the hook member 420 as the rotation axis.

If the other end portion of the RRH 200 is pushed to move toward the antenna module 100, the locking member that is formed to project from both end portions of the lower portion of the RRH 200 is locked in the opening of the locking plate that is provided on the lower portion of the antenna module 100, and the locking plate is elastically rotated on the support plates to cause the opening to be drawn between the support plates, so that the locking member may be locked in a state where it is seated in the opening (refer to the first embodiment as described above). Accordingly, the RRH 200 can be stably coupled to the rear surface of the antenna module 100.

The first connection portion 150 and the second connection portion 250 have a blind mating structure. If the RRH 200 is locked in and fixed to the antenna module 100, the second housing is seated on the first housing, and the second terminal portion and the first terminal portion are engaged with each other. Further, by rotating the lever portion in a vertical direction to the surface of the second connection portion 250, the coupling modules 140 and 240 are switched to the driving mode.

If the lever portion that projects from the second connection portion 250 is rotated clockwise or counterclockwise, the second housing that is provided with the second terminal portion is rotated and moves straight, and the second terminal portion moves straight toward the first terminal portion, so that the first terminal portion and the second terminal portion may be electrically coupled to each other. If the lever portion is seated again in the opening of the second connection portion 250 after the second connection portion 250 is driven, the coupling modules 140 and 240 are switched to the locking mode, and the RRH 200 is maintained in a state where it is coupled to the antenna module 100. As described above, the RRH 200 is detachably provided on the antenna module 100, and can be electrically coupled to the antenna module 100 without any separate tool.

Further, the RRH 200 that has been coupled to the antenna module 100 is separated from the antenna module 100 as follows. On the contrary to the coupling of the RRH 200 to the antenna module 100, the coupling modules 140 and 240 are first switched from the locking mode to the driving mode. That is, the lever portion secedes from the opening, and the lever portion 260 that projects from the second connection portion 250 is rotated clockwise or counterclockwise to drive the second connection portion 250 in a direction in which the second connection portion 250 goes away from the first connection portion 150. Accordingly, the electrical coupling of the second terminal portion and the first terminal portion is disconnected, and the second housing is maintained only in a state where the second housing is seated on the first housing. If the locking plate is operated in this state, the locking plate is rotated between the support plates, and the opening that is drawn into the support plates is exposed to the outside. If the locking member that is locked in the opening that is exposed to the outside is pulled and the other end portion of the RRH 200 is pulled, the lower slider 430 may move in a direction in which the lower slider goes away from the antenna module 100 along the guide groove. If a worker makes the hook member 420 secede from the locking bar member 320, the RRH 200 may be separated from the antenna module 100.

In an embodiment of the present disclosure as described above, even in the case where the RRH 200 secedes from the antenna module 100, a separate tool is not needed. Accordingly, worker's convenience is increased, and a safety accident that is caused by a separate attachment/detachment tool or the like can be prevented from occurring.

Hereinafter, referring to FIGS. 16 to 21, an antenna device 10 according to a third embodiment of the present disclosure will be described. In explaining the antenna device 10 according to the third embodiment, the above description may be preferentially applied with respect to the same configuration or operation as that of the antenna device 10 as described above.

Figure 16:
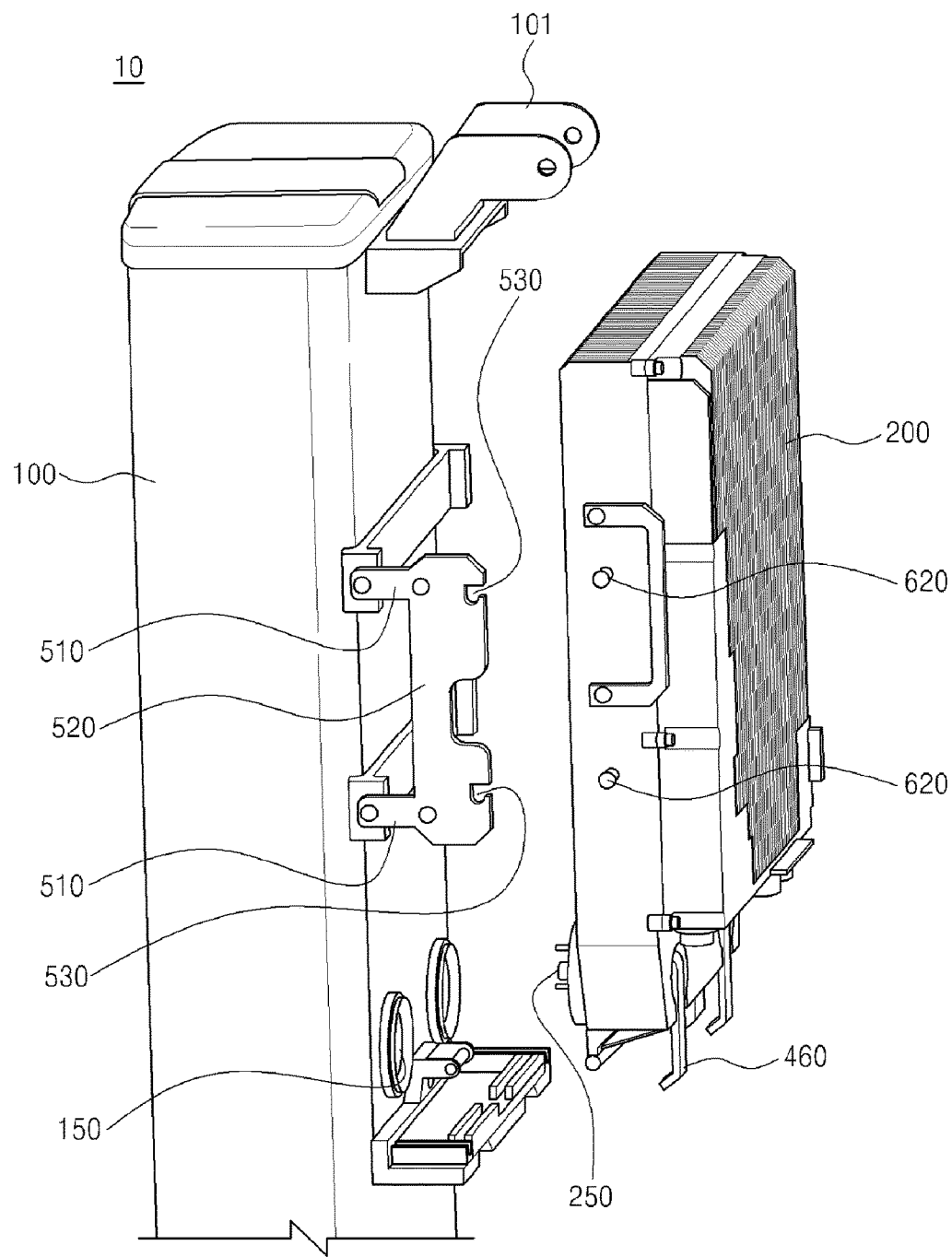
FIG. 16 is a side perspective view illustrating a state where an antenna module and an RRH are separated from each other in an antenna device according to one of various embodiments of the present disclosure.
Figure 17:
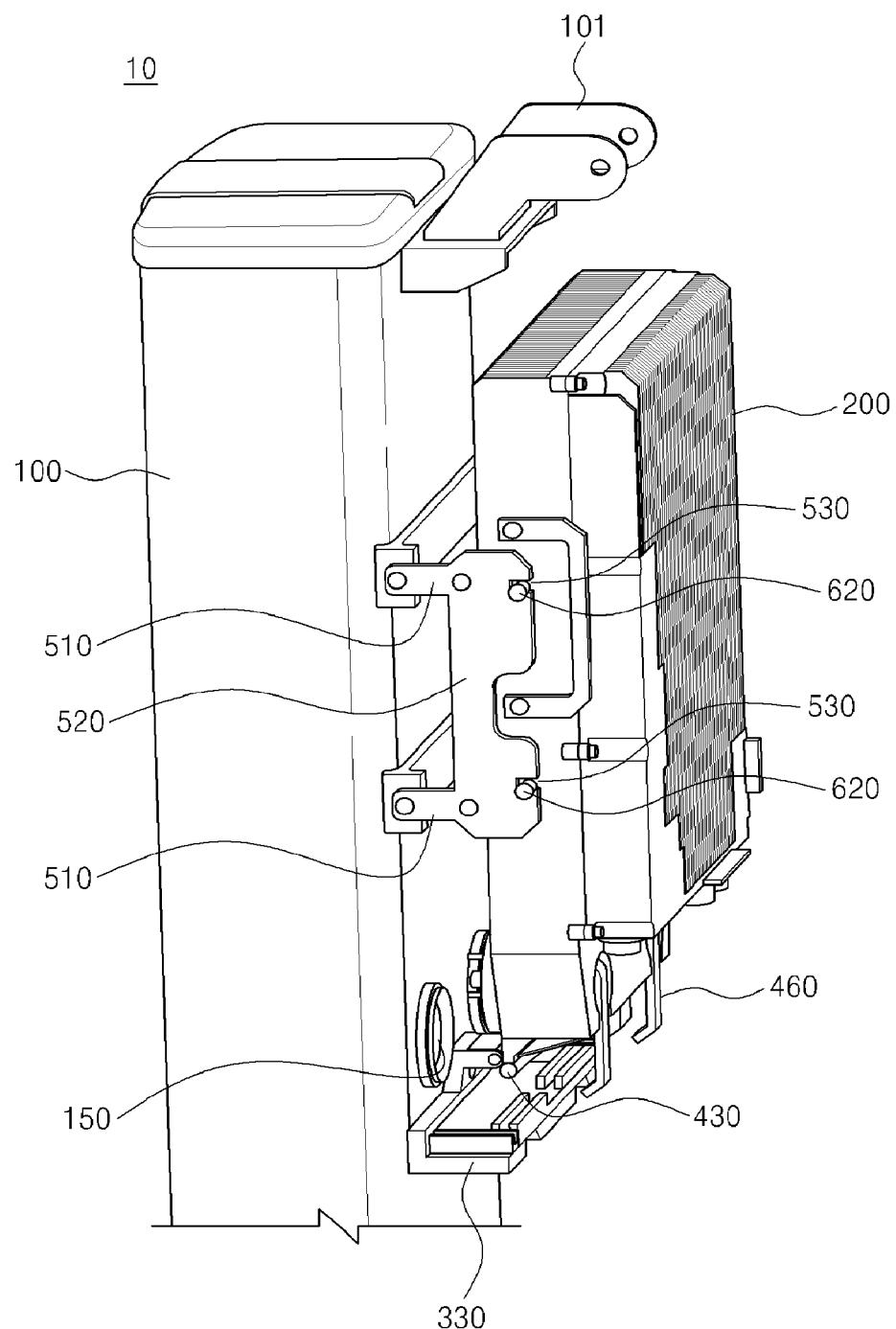
FIG. 17 is a side perspective view illustrating a state where an antenna module and an RRH are primarily coupled to each other in an antenna device according to one of various embodiments of the present disclosure.
Figure 18:
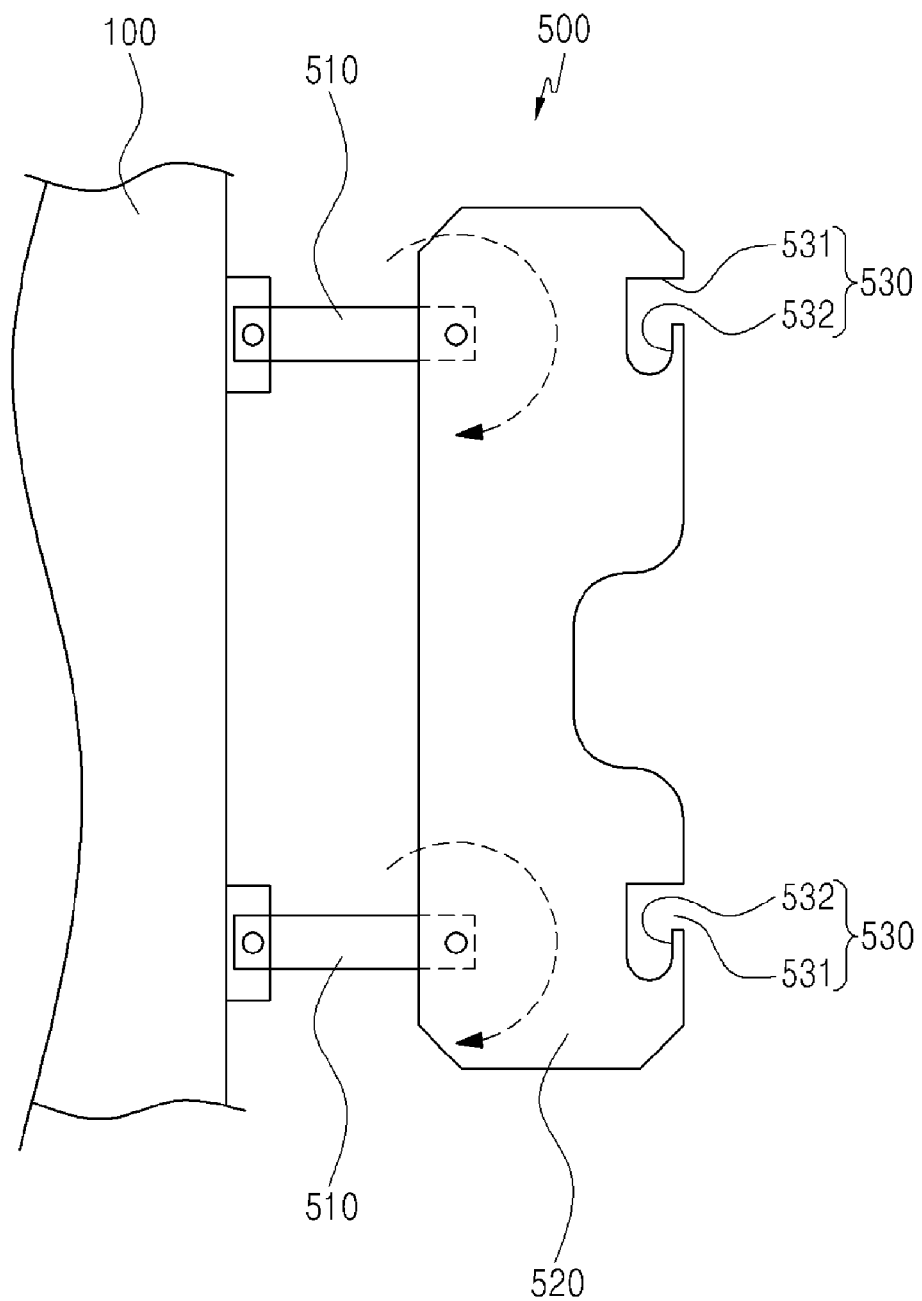
FIG. 18 is a view illustrating an attachment/detachment member, specifically, a link module, according to one of various embodiments of the present disclosure.
Figure 19:
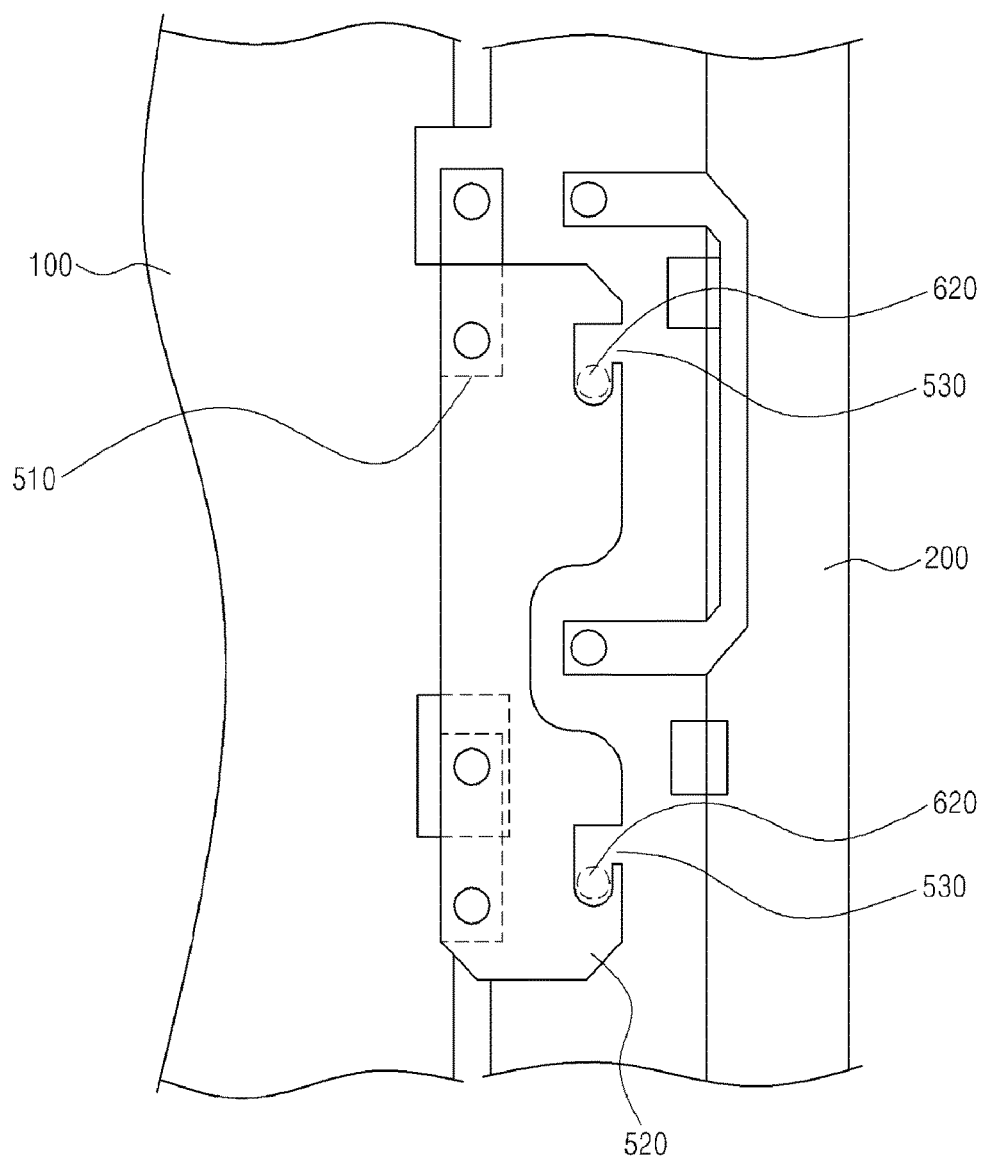
FIG. 19 is an enlarged view illustrating a state where an attachment/detachment member, specifically, a link module, is driven according to one of various embodiments of the present disclosure.

FIG. 16 is a side perspective view illustrating a state where an antenna module 100 and an RRH 200 are separated from each other in an antenna device 10 according to one of various embodiments of the present disclosure, and FIG. 17 is a side perspective view illustrating a state where an antenna module 100 and an RRH 200 are primarily coupled to each other in an antenna device 10 according to one of various embodiments of the present disclosure. FIG. 18 is a view illustrating attachment/detachment members 500 and 620, specifically, link modules 500 and 620, according to one of various embodiments of the present disclosure, and FIG. 19 is an enlarged view illustrating a state where attachment/detachment members 500 and 620, specifically, link modules 500 and 620, are driven according to one of various embodiments of the present disclosure.

Referring to FIGS. 16 to 19, the antenna device 10 according to an embodiment of the present disclosure is different from the antenna device 10 as described above on the point of the structure for mounting the RRH 200 on the antenna module 100. That is, the RRH 200 as described above has a structure in which the RRH 200 slidably moves in the form of a slant line in a direction that is measured from one side to the other side of the antenna module 100, and then is coupled to the antenna module 100 through pushing of the lower portion of the RRH 200 toward the antenna module 100, or a structure in which the RRH 200 is coupled to the antenna module 100 through pushing of the other end portion of the RRH 200 in a state where the RRH 200 is coupled to the antenna module 100 in the form of the slant line.

In contrast, the RRH 200 according to an embodiment of the present disclosure may be seated to be spaced apart for a predetermined distance from the rear surface of the antenna module 100 through attachment/detachment members 500 and 620, such as link modules 500 and 620, and then is rotated and moves straight from the upper portion to the lower portion of the rear surface of the antenna module 100 to come in close contact with the rear surface of the antenna module 100, so that the RRH 200 is coupled to the rear surface of the antenna module 100.

Specifically, the attachment/detachment members may be provided on both side surfaces of the antenna module 100 and the RRH 200 so that the RRH 200 is attached to or detached from one surface of the antenna module 100. The attachment/detachment members may be provided as the link modules 500 and 620 configured to cause the both side surfaces of the RRH 200 to be seated, to rotate and move straight the RRH 200 from the upper portion to the lower portion of the rear surface of the antenna module 100, and to cause the RRH 200 to be attached to or detached from the rear surface of the antenna module 100.

In an embodiment of the present disclosure, the link modules 500 and 620 may include one or more projection portions 620 and the link members 500.

It is exemplified that at least one projection portion 620 projects from both side surfaces of the RRH 200, and in an embodiment of the present disclosure, two projection portions 620 project in the first direction X from one side surface of the RRH 200.

The link member 500 may be provided on both side surfaces of the antenna module 100, and may include a coupling plate 520 and a rotator 510. The rotator 510 may be rotatably coupled to upper and lower portions of the side surface of the antenna module 100. Further, one coupling plate 520 may be rotatably coupled to a pair of rotators 510. An opening 530 on which the projection portion 620 is locked and seated may be provided on the coupling plate 520. The opening 530 may be partitioned into an inlet port 531 into which the projection portion 620 is drawn and a seat portion 532 on which the projection portion 620 is locked and seated, and the seat portion 532 may be formed to be drawn downward from the inlet port 531. However, the shape of the opening 530 may be modified or changed without limit so far as the opening has a shape or a structure in which the projection portion 620 can be locked. The coupling plate 520 may be coupled to the rotator 510, and may move straight in a slant line in a direction in which the coupling plate becomes closer to the antenna module 100 in accordance with the rotation of the rotator 510. The rotator 510 may project in the direction of the RRH 200 from the rear surface of the antenna module 100, and may be rotated downward about a portion that is coupled to the antenna module 100 as a rotation axis.

In a state where the RRH 200 is positioned on the rear surface of the antenna module 100, the projection portion 620 is locked and seated in the opening 530. Accordingly, the RRH 200 may be coupled to the rear surface of the antenna module 100 in a state where the RRH 200 is spaced apart for a predetermined distance from the rear surface of the antenna module 100 in parallel to the antenna module 100. If the projection portion 620 is seated in the opening 530 and the RRH 200 is positioned on the rear surface of the antenna module 100, the rotator 510 is rotated about one side of the rotator 510 as a rotation axis so that the rotator is in the same direction as the direction of the side surface of the antenna module 100 (corresponding to the gravity direction) in a state where the rotator projects in a Z direction from the antenna module 100. The coupling plate 520 that is rotatably coupled to the other side of the rotator 510 may move in a slant line in a direction in which the coupling plate becomes closer to the rear surface of the antenna module 100 in a state where the coupling plate is spaced apart for a predetermine distance from the rear surface of the antenna module 100. Accordingly, the RRH 200 may move in a direction measured from the upper portion to the lower portion of the antenna module 100, and may move in the direction in which the RRH 200 becomes close to the rear surface of the antenna module 100 in a state where the RRH 200 is spaced apart for the predetermined distance from the rear surface of the antenna module 100. If the RRH 200 moves to approach the rear surface of the antenna module 100, the second connection portion 250 that is positioned on the front surface of the RRH 200 may be connected to the first connection portion 150 that is positioned on the rear surface of the antenna module.

Although not illustrated, like the antenna device 10 according to the first embodiment as described above, the antenna device 10 according to an embodiment of the present disclosure may be provided with the coupling modules which can fix the RRH 200 to the antenna module 100 and can stably maintain the electrical connection state between the connection modules. Since the corresponding configuration has been described in the first embodiment, it may be preferentially applied in this embodiment. However, the fixing member may be positioned in a specific position of the lower portion of the rear surface of the antenna module 100. Further, the locking member may be formed to project in the X direction from the specific position of the RRH 200 that corresponds to the fixing member (see FIGS. 5 to 8).

Further, as in the first embodiment as described above, if the other end portion of the RRH 200 moves adjacent to the antenna module 100, the first connection portion 150 that is provided on the rear surface of the antenna module 100 may be connected to the second connection portion 250 that is provided on one surface of the RRH 200. Since the corresponding configuration, operation, and attachment/detachment structure are the same as the contents as described above in the first embodiment, they may be preferentially applied in this embodiment. Briefly, if the RRH 200 approaches the rear surface of the antenna module 100, the first terminal portion and the second terminal portion may be engaged with each other in a state where they are surrounded by the first housing and the second housing. Further, if the RRH 200 is positioned in parallel to the antenna module 100, the first terminal portion and the second terminal portion are engaged with each other, and the coupling modules may be driven for electrical coupling of the first terminal portion and the second terminal portion. That is, the coupling modules may move the second terminal portion that is blinded as being surrounded by the first housing and the second housing straight toward the first terminal portion, so that the second terminal portion is coupled to or decoupled from the first terminal portion (see FIGS. 5 to 8).

As described above even in the first embodiment, the coupling modules may be provided on the rear surface of the RRH 200, specifically, on the rear surface of the second connection portion 250, so that a worker can electrically connect the RRH 200 to the antenna module 100 without any separate tool. The coupling modules may be driven in two modes of a locking mode and a driving mode. The locking mode corresponds to a state where the driving of the second connection portion 250 is limited. If the lever portion is seated in the opening of the rear surface of the second connection portion 250, the driving of the lever portion may be limited, and the driving of the second connection portion 250 may be locked (see FIGS. 5 to 8).

Figure 21:
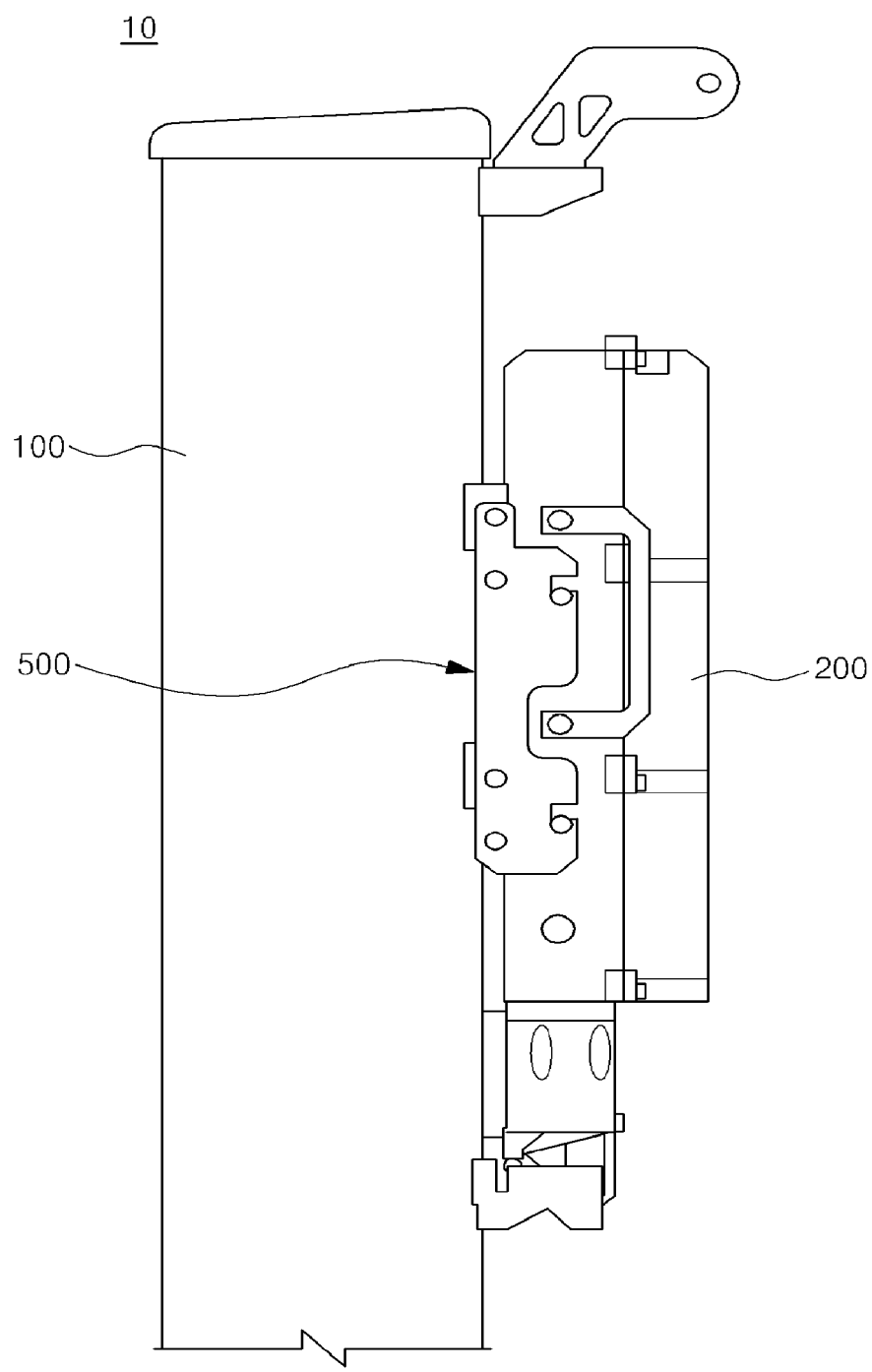
FIG. 21 is a view illustrating a state where an RRH is attached to the rear surface of an antenna module in an antenna device according to one of various embodiments of the present disclosure.

FIGS. 20A and 20B are views illustrating a state before an RRH 200 is attached to the rear surface of an antenna module 100 in an antenna device 10 according to one of various embodiments of the present disclosure, and FIG. 21 is a view illustrating a state where an RRH 200 is attached to the rear surface of an antenna module 100 in an antenna device 10 according to one of various embodiments of the present disclosure.

Referring to FIGS. 20A, 20B, and 21, a process in which the RRH 200 is attached to or detached from the antenna module 100 in a state where the antenna device 10 is supported on an outer wall will be described. The antenna module 100 is fixed to the outer wall. That is, an upper portion of the antenna module 100 may be supported on the outer wall by an upper fixing module, and a lower portion of the antenna module 100 may be supported on the outer wall by a lower fixing module. If the antenna module 100 is fixed to the outer wall, a space in which the RRH 200 is to be mounted may be formed between the antenna module 100 and the outer wall.

Link modules 500 and 620 may be provided on both side surfaces of the rear surface of the antenna module 100. The RRH 200 may be positioned in parallel to the antenna module 100 on the rear surface of the antenna module 100, and the projection portion 620 of the RRH 200 is seated in the opening 530 that is provided on the coupling plate 520. If the projection portion 620 is seated on and coupled to the opening 530, the rotator 510 may be rotated about one side of the rotator 510 as a rotation axis. The coupling plate 520 that is coupled to the RRH 200 may move to the lower portion of the antenna module 100 and may move in a direction of the rear surface of the antenna module 100. Accordingly, the RRH 200 may move to approach the rear surface of the antenna module 100 in a state where the RRH 200 is spaced apart for a predetermined distance from the rear surface of the antenna module 100, and if the RRH 200 is positioned on the rear surface of the antenna module 100, the first connection portion 150 and the second connection portion 250 are positioned to face each other in a state where they are spaced apart from each other.

If the RRH 200 moves toward the antenna module 100, the locking member that is formed to project from both end portions of the lower portion of the RRH 200 is locked in the opening 530 of the locking plate that is provided on the lower portion of the antenna module 100, and the locking plate is elastically rotated on the support plates to cause the opening 530 to be drawn between the support plates, so that the locking member may be locked in a state where it is seated in the opening 530 (refer to the first embodiment as described above). Accordingly, the RRH 200 can be stably coupled to the rear surface of the antenna module 100.

The first connection portion 150 and the second connection portion 250 have a blind mating structure. If the RRH 200 is locked in and fixed to the antenna module 100, the second housing is seated on the first housing, and the second terminal portion and the first terminal portion are engaged with each other. Further, by rotating the lever portion in a vertical direction to the surface of the second connection portion 250, the coupling modules are switched to the driving mode (see FIGS. 5 to 8).

If the lever portion that projects from the second connection portion 250 is rotated clockwise or counterclockwise, the second housing that is provided with the second terminal portion is rotated and moves straight, and the second terminal portion moves straight toward the first terminal portion, so that the first terminal portion and the second terminal portion may be electrically coupled to each other. If the lever portion is seated again in the opening 530 of the second connection portion 250 after the second connection portion 250 is driven, the coupling modules are switched to the locking mode, and the RRH 200 is maintained in a state where it is coupled to the antenna module 100. As described above, the RRH 200 is detachably provided on the antenna module 100, and can be electrically coupled to the antenna module 100 without any separate tool (see FIGS. 5 to 8).

Further, the RRH 200 that has been coupled to the antenna module 100 is separated from the antenna module 100 as follows. On the contrary to the coupling of the RRH 200 to the antenna module 100, the coupling modules are first switched from the locking mode to the driving mode. That is, the lever portion secedes from the opening 530, and the lever portion 260 that projects from the second connection portion 250 is rotated clockwise or counterclockwise to drive the second connection portion 250 in a direction in which the second connection portion 250 goes away from the first connection portion 150. Accordingly, the electrical coupling of the second terminal portion and the first terminal portion is disconnected, and the second housing is maintained only in a state where the second housing is seated on the first housing. If the locking plate is operated in this state, the locking plate is rotated between the support plates, and the opening 530 that is drawn into the support plates is exposed to the outside. If the locking member that is locked in the opening 530 that is exposed to the outside is pulled and the RRH 200 is raised upward, the link modules 500 and 620 may move to their original positions, and since the projection portion 620 secedes from the opening 530, the RRH 200 may be separated from the antenna module 100 (see FIGS. 5 to 8).

Figure 22:
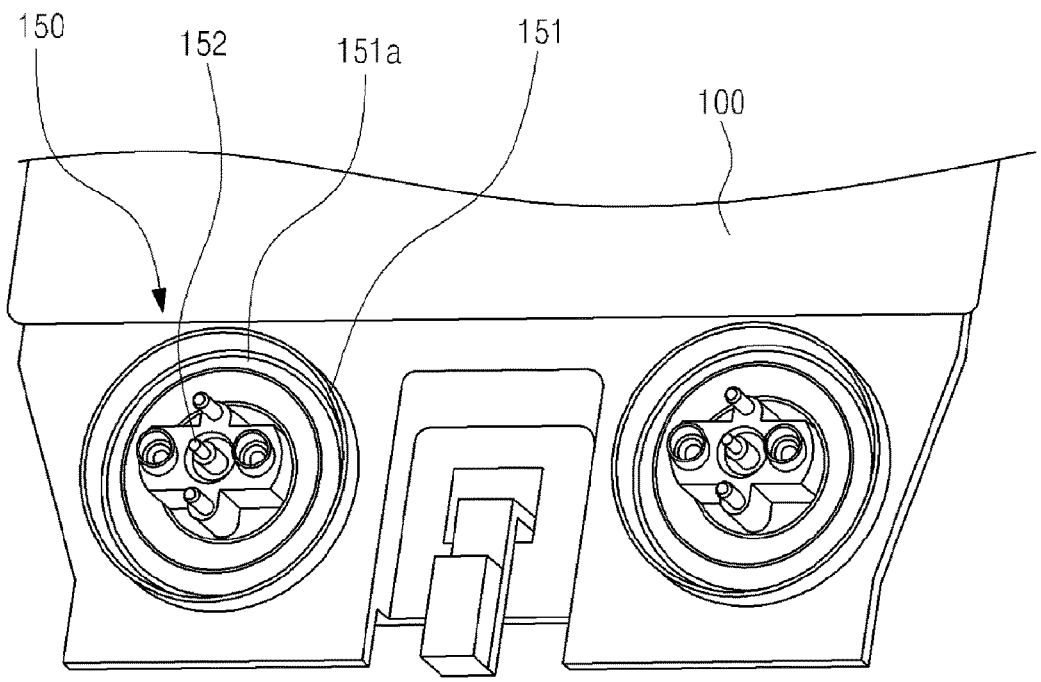
FIG. 22 is a view illustrating another example of a first connection portion in an antenna device according to an embodiment of the present disclosure.
Figure 23:
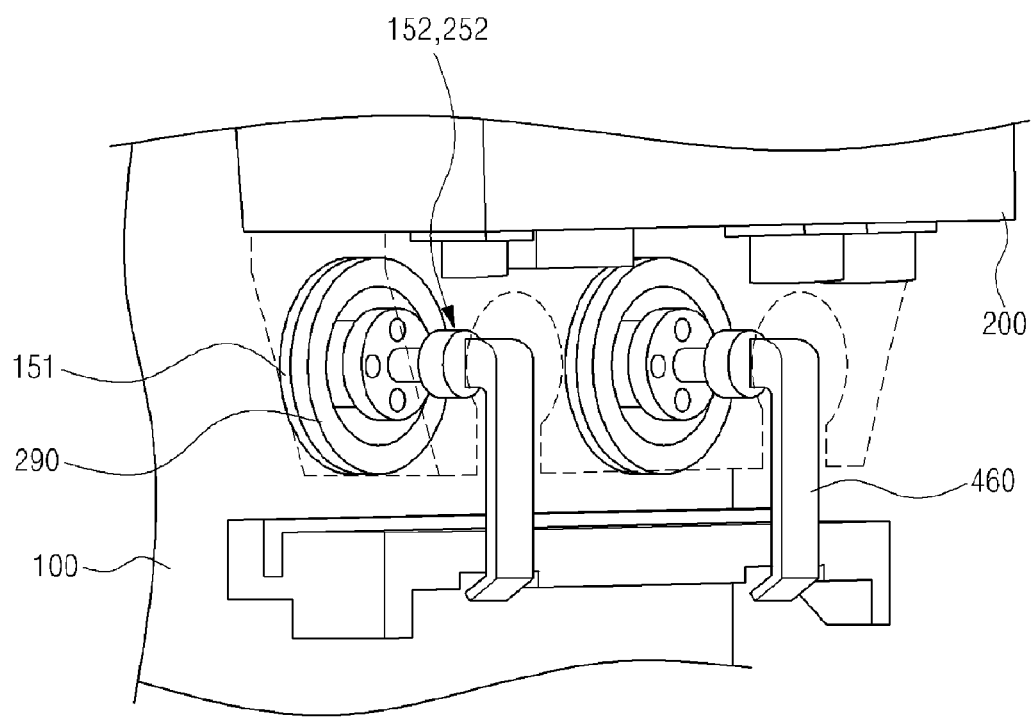
FIG. 23 is a view schematically illustrating a state where a first connection portion and a second connection portion according to another embodiment are coupled to each other in an antenna device according to an embodiment of the present disclosure.
Figure 24:
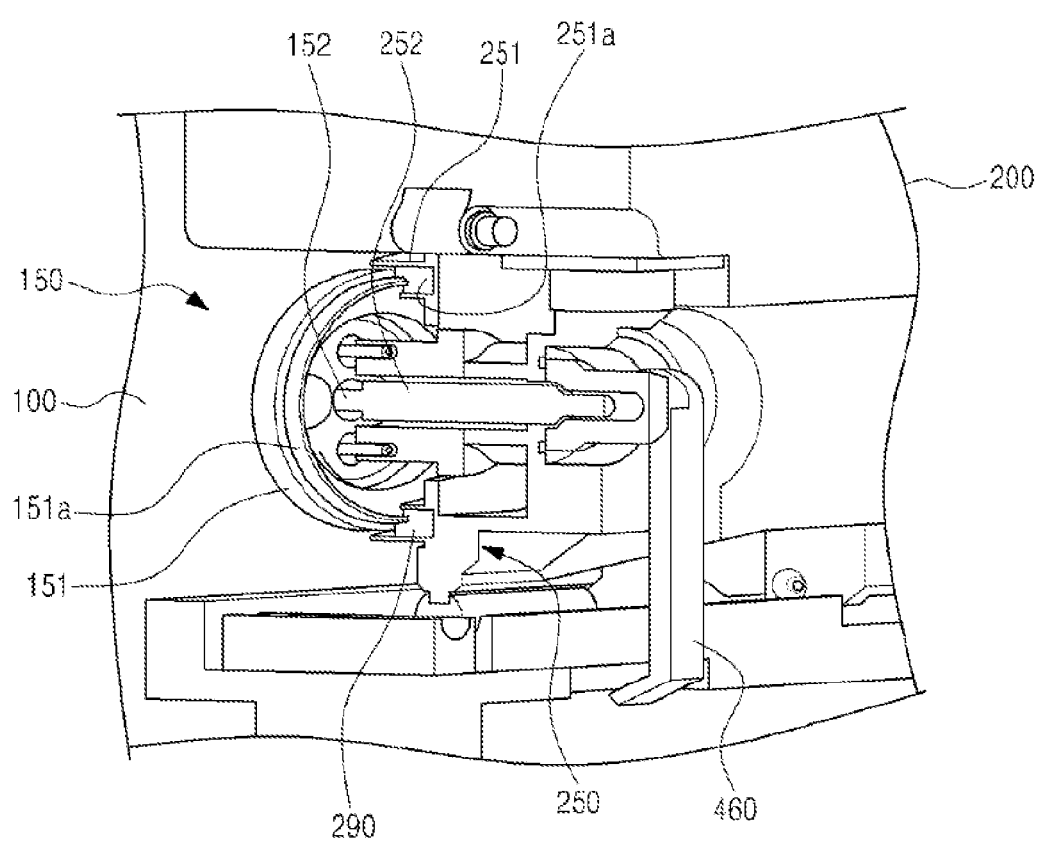
FIG. 24 is a view illustrating a partial cross-section of a state where a first connection portion and a second connection portion according to another embodiment are coupled to each other in an antenna device according to an embodiment of the present disclosure.
Figure 25:
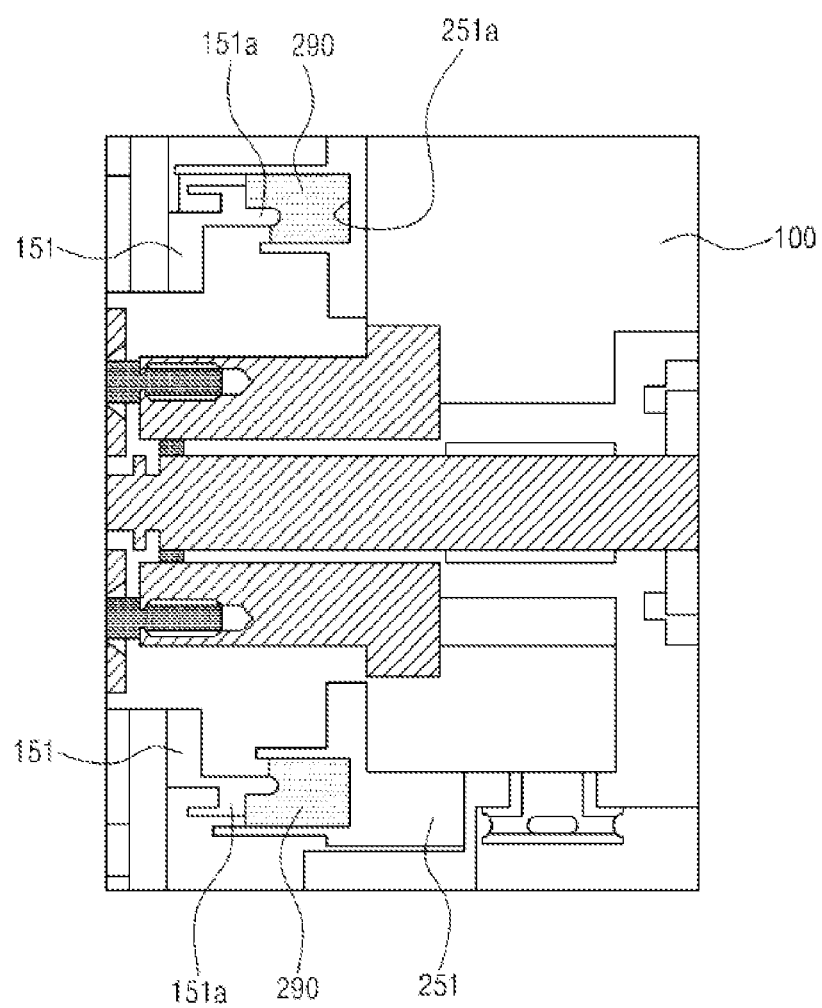
FIG. 25 is a view schematically illustrating a state where a first connection portion and a second connection portion are coupled to each other according to the present disclosure.
Figure 26:
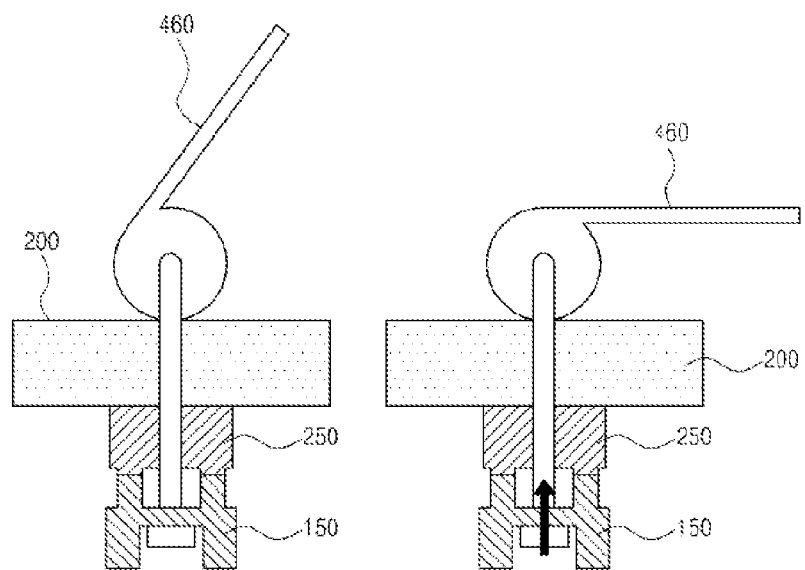
FIG. 26 is a view explaining coupling driving of a first connection portion and a second connection portion in accordance with driving of a lever portion in an antenna device according to an embodiment of the present disclosure.

FIG. 22 is a view illustrating another example of a first connection portion 150 in an antenna device according to an embodiment of the present disclosure, and FIG. 23 is a view schematically illustrating a state where a first connection portion 150 and a second connection portion 250 according to another embodiment are coupled to each other in an antenna device according to an embodiment of the present disclosure. FIG. 24 is a view illustrating a partial cross-section of a state where a first connection portion 150 and a second connection portion 250 according to another embodiment are coupled to each other in an antenna device according to an embodiment of the present disclosure, and FIG. 25 is a view schematically illustrating a state where a first connection portion 150 and a second connection portion 250 are coupled to each other according to the present disclosure. FIG. 26 is a view explaining coupling driving of a first connection portion 150 and a second connection portion 250 in accordance with driving of a lever portion 460 in an antenna device according to an embodiment of the present disclosure.

Referring to FIGS. 22 to 25, on surfaces on which the antenna module 100 and the RRH 200 face each other, specifically, in directions of the rear surface of the antenna module 100 and the front surface of the RRH 200, connection modules 150 and 250 for electrically connecting the antenna module 100 and the RRH 200 are provided. In a similar manner to the connection modules 150 and 250 according to the previous embodiment, the connection modules 150 and 250 according to an embodiment of the present disclosure may include a first connection portion 150 and a second connection portion 250. The coupling structure and the coupling type of the first connection portion 150 and the second connection portion 250 that are included in the connection modules according to this embodiment are different from those in the connection modules according to the previous embodiment.

Specifically, in an embodiment of the present disclosure, the first connection portion 150 may be provided to be drawn to the inside of the rear surface of the antenna module 100. Further, the second connection portion 250 may be formed to project from the RRH 200 and may be drawn toward the first connection portion 150 to come in close contact with the first connection portion 150. If the other end portion of the RRH 200 moves in the second direction Y in which the other end portion of the RRH 200 gets near to or goes away from the antenna module 100, the second connection portion 250 may be drawn into and engaged with the inside of the first connection portion 150 or may be drawn out and secede from the inside of the first connection portion 150. The second connection portion 250 moves straight to the first connection portion 150 to be electrically connected to each other through the driving of the coupling modules 140 and 240 to be described later in a state where the second connection portion 250 comes in close contact with the first connection portion 150.

The first connection portion 150 may include a first terminal portion 152 and a first housing 151. The first housing 151 may be provided around the first terminal portion 152 that is provided to be drawn into the inside of the rear surface of the antenna module 100. In an embodiment of the present disclosure, a seat projection surface 151a that projects with a step height toward a peripheral portion of the first terminal portion 152 may be provided on the first housing 151. The seat projection surface 151a may be provided to be drawn onto a drawing seat surface 251a of the second connection portion 250 to be described later. If a user drives the lever portion 460 in a state where the RRH 200 is positioned on the rear surface of the housing, to be described later, the drawing seat surface 251a moves straight to come in close contact with the seat projection surface 151a in a state where the seat projection surface 151a is drawn into the drawing seat surface 251a.

That is, according to the previous embodiment, the screw threads are formed on the circumferential surface of the inside of the first housing 151 to be engaged with the screw pattern that is formed on the inner surface of the second housing 251, and are rotated to make the second terminal portion 252 of the second connection portion 250 move straight in the second direction Y in accordance with the driving of the lever portion 460. In contrast, according to this embodiment of the present disclosure, the first housing 151 is drawn in and coupled to the second housing 251, and then moves straight toward the second housing 251, so that the first housing 151 and the second housing 251 are tightly engaged with each other.

The first terminal portion 152 is formed to project from the inside of the rear surface of the antenna module 100 as being surrounded by the first housing 151. The first terminal portion 152 may be elastically mounted on the first housing 151. If the other end portion of the RRH 200 that is guided and moved to the antenna module 100 in an inclined state is pushed toward the antenna module 100, the first terminal portion 152 may be elastically driven and stably engaged with the second terminal portion 252 of the second connection portion 250.

The second connection portion 250 may include the second terminal portion 252 and the second housing 251.

In an embodiment of the present disclosure, the second housing 251 may be mounted in a position that faces the antenna module 100, and may be formed to project to the lower portion of the RRH 200. The second housing 251 is provided around the second terminal portion 252, and in the second housing 251, the drawing seat surface 251a in the shape of a recessed groove may be provided along the circumference of the second housing 251 so that the above-described seat projection surface 151a is inserted into the drawing seat surface 251a. If the first connection portion 150 and the second connection portion 250 are engaged with each other, the seat projection surface 151a of the first housing 151 is inserted into and engaged with the drawing seat surface 251a of the second housing 251. The second housing 251 moves straight in the second direction so as to come in close contact with the inside of the first housing 151 in accordance with the driving of the lever portion 460 to be described later. Further, in a state where the second terminal portion 252 is engaged with the first terminal portion 152, the second housing moves straight along the second direction to come in close contact with the first housing 151 in accordance with the driving of the lever portion 460, and the second terminal portion 252 moves straight along the second direction Y to be electrically coupled to or decoupled from the first terminal portion 152.

For example, in a state where the first terminal portion 152 and the second terminal portion 252 are engaged with each other, the electrical coupling is performed as follows. First, the RRH 200, which moves in the first direction X in the antenna module 100, is rotated and moves in the second direction Y to come in close contact with the rear surface of the antenna module 100. If the RRH 200 comes in close contact with the rear surface of the antenna module 100, the second housing 251 is drawn into the first housing 151, and the first terminal portion 152 and the second terminal portion 252 are engaged with each other. In this case, the first terminal portion 152 and the second terminal portion 252 are engaged with each other, but have not yet been electrically coupled to each other. In this state, if the lever portion 460 that is provided in the second connection portion 250 to be described later is driven, the first connection portion moves toward the second connection portion 250, specifically, the first terminal portion 152 moves straight toward the second terminal portion 252, and thus the first terminal portion 152 and the second terminal portion 252 can be electrically coupled to each other.

Further, on the inside of the drawing seat surface 251a, a sealing member 290 may be further provided to make the drawing seat surface 251a and the seat projection surface 151a be closely coupled to each other during the coupling thereof. That is, if the end portion of the seat projection surface 151a comes in close contact with the inside of the drawing seat surface 251a in accordance with the driving of the lever portion 460, the end portion of the seat projection surface 151a presses the sealing member 290 to come in close contact with the sealing member 290 to limit the drawing of foreign substances into the insides of the first housing 151 and the second housing 251. The sealing member 290 may include an elastic material, for example, at least one of urethane, silicon, and rubber.

As described above, the lever portion 460 may be driven to make the first and second terminal portions 152 and 252, which are only engaged with each other in accordance with the close contact of the RRH 200 with the antenna module 100, be electrically coupled to or decoupled from each other. If the RRH 200 is arranged on the rear surface of the antenna module 100, the first terminal portion 152 and the second terminal portion 252 are not exposed to an outside in a state where they are surrounded by the first housing 151 and the second housing 251 in accordance with the close contact of the first housing 151 with the second housing 251. Further, if the RRH 200 moves to be positioned in parallel to the antenna module 100, the first terminal portion 152 and the second terminal portion 252 are engaged with each other, but are not electrically coupled to each other. The lever portion 460 is driven to make the second terminal portion 252 that is blinded as being surrounded by the first housing 151 and the second housing 251 move straight toward the first terminal portion 152 so that the second terminal portion 252 is coupled to or decoupled from the first terminal portion 152.

The lever portion 460 may be rotatably provided on the rear surface of the second connection portion 250, and maybe provided to be seated in the opening that is provided on the rear surface of the second connection portion 250. The lever portion 460 may be seated in the opening that is formed on the second connection portion 250 and may be positioned to face the surface of the second connection portion 250. The lever portion 460 may be provided to move for a first rotation so as to project in a vertical direction to the surface of the second connection portion 250 about one end that is rotatably coupled to the second connection portion 250 as a center axis, and the lever portion 460 that projects from the surface of the second connection portion 250 may be provided to move for a second rotation about the center axis. If the lever portion 460 moves for the first rotation on the second connection portion 250, the lever portion 460 is positioned in parallel to the surface of the second connection portion 250, and is seated in or secedes from the opening to project in the vertical direction to the surface of the second connection portion 250. If the lever portion 460 that projects from the second connection portion 250 moves for the second rotation around the one end thereof, it guides the first connection portion 150 and the second connection portion 250 to move straight in a direction in which they get near to or go away from each other.

Even in an embodiment of the present disclosure as described above, even in the case where the RRH 200 secedes from the antenna module 100, a separate tool is not needed. Accordingly, worker's convenience is increased, and a safety accident that is caused by a separate attachment/detachment tool or the like can be prevented from occurring.

As described above, the present disclosure is described with reference to specific matters such as the detailed components and the limited exemplary embodiments, but it will be apparent to those of ordinary skill in the art to which the present disclosure pertains that various changes and modifications can be made within a range that does not deviate from the scope of the present disclosure.

The invention claimed is:

1. An antenna device comprising: an antenna module; a radio remote head (RRH) configured to receive signals from the antenna module and a base station; an attachment/detachment member configured to attach/detach the RRH to/from one surface of the antenna module; connection modules provided on a surface on which the antenna module and the RRH face each other to electrically connect the RRH and the antenna module to each other; and coupling modules provided on one surface of the RRH to move the connection modules so that the connection modules are coupled to or separated from each other; wherein the attachment/detachment member is provided on upper and lower portions of the antenna module and the RRH as guide modules configured to slidably guide the RRH on the antenna module, to cause one end portion of the RRH to be rotatably seated, and to cause the other end portion of the RRH to be seated to be movable toward the antenna module.

2. The antenna device of claim 1, wherein the guide module comprises:
an upper end rail portion provided on an upper portion of the antenna module and coupled to one end portion of the RRH to form a circular hollow portion in a sliding direction so as to slidably move and rotatably support the one end portion of the RRH;
an upper end slider provided on an upper portion of the RRH, formed in a bar shape in the sliding movement direction, and seated on the upper end rail portion to slidably move along the first guide module or to be rotated on the first guide module;
a lower end rail portion provided on a lower portion of the antenna module, and coupled to the other end portion of the RRH to slidably move the other end portion of the RRH and to movably support the RRH in a direction in which the RRH gets adjacent to or goes away from the antenna module about the one end portion of the RRH as a rotation axis; and
a lower end slider provided on a lower portion of the RRH, and seated on a second guide portion to slidably move along the second guide portion or to move in a vertical direction to a sliding movement direction.

3. The antenna device of claim 2, wherein the lower end rail portion comprises a first-direction guide groove having the sliding movement direction and a second-direction guide groove having the vertical direction to the sliding movement direction, and
the lower end slider is formed to project from at least one of the lower portion of the RRH and a lower portion of the connection module to slidably move along the first-direction guide groove and the second-direction guide groove.

4. The antenna device of claim 3, wherein the RRH slidably moves in the form of a slant line in a direction that is measured from one side to the other side of the antenna module, and then is coupled to the antenna module through pushing of the lower portion of the RRH toward the antenna module.

5. The antenna device of claim 4, wherein the upper end rail portion is seated on the upper end slider, the lower end rail portion is seated in the first-direction guide groove, and the RRH slidably moves to a rear surface of the antenna module in the form of a slant line in the direction that is measured from the one side to the other side of the antenna module, and the lower end slider moves along the second-direction guide groove, the upper end slider is rotated on the upper end rail portion, and the RRH is coupled to the rear surface of the antenna module.

6. The antenna device of claim 1, wherein the coupling module comprises:
a locking plate provided on a rear surface of the antenna module, provided with a hook-shaped opening, and detachably coupling and fixing the other end portion of the RRH in at least one of automatic and manual manners; and
a locking projection provided to project in a side surface direction from a front surface of the RRH to be locked in or unlocked from the opening of the locking plate.

7. The antenna device of claim 1, wherein the connection module has a blind mating structure, and comprises:
a first connection portion formed to project from a rear surface of the antenna module; and
a second connection portion provided on the RRH and positioned to face the first connection portion to be elastically engaged with the first connection portion in accordance with a movement in a direction that is vertical to a sliding movement direction of the other end portion of the RRH.

8. The antenna device of claim 7, wherein the coupling module comprises:
a lever portion provided in an opening that is provided on a rear surface of the second connection portion; and
a movement portion configured to move the second connection portion so that the second connection portion is electrically coupled to the first connection portion in accordance with a rotation of the lever portion.

9. The antenna device of claim 8, wherein the coupling module comprises a locking mode in which the lever portion is seated in the opening to limit a movement of the second connection portion, and a driving mode in which the lever portion secedes from the opening and is rotated to move the second connection portion in a direction in which the second connection portion goes away from or gets near to the first connection portion so that the second connection potion is electrically attached to or detached from the first connection portion.

10. The antenna device of claim 9, wherein the first connection portion and the second connection portion push or pull the other end portion of the RRH in a direction in which the other end portion of the RRH moves to get near to or to go away from the antenna module to cause the other end portion of the RRH to be seated on the antenna module, and
the first connection portion moves along the movement portion in accordance with rotation driving of the lever portion to be electrically attached to or detached from the second connection portion.

11. An antenna device comprising: an antenna module; a radio remote head (RRH) configured to receive signals from the antenna module and a base station; an attachment/detachment member configured to attach/detach the RRH to/from one surface of the antenna module; connection modules provided on a surface on which the antenna module and the RRH face each other to electrically connect the RRH and the antenna module to each other; and coupling modules provided on one surface of the RRH to move the connection modules so that the connection modules are coupled to or separated from each other;

wherein the attachment/detachment member is provided on upper and lower portions of the antenna module and the RRH as guide modules configured to cause one end portion of the RRH to be locked and rotatably seated, to guide the other end portion of the RRH to move in a direction in which the other end portion of the RRH gets near to or goes away from the antenna module in accordance with rotation of the RRH, and to cause the other end portion of the RRH to be seated.

12. The antenna device of claim 11, wherein the guide module comprises:
   at least one locking bar member provided on an upper side of the antenna module to cause the one end portion of the RRH to be rotatably locked and seated;
   at least one hook member provided on an upper portion of the RRH to be rotatably locked and seated on the locking bar member;
   a lower end rail portion provided on a lower portion of the antenna module, and coupled to the other end portion of the RRH to guide and support the other end portion of the RRH to move in a direction in which the other end portion of the RRH gets adjacent to or goes away from the antenna module about the one end portion of the RRH as a rotation axis; and
   a lower end slider provided on the lower portion of the RRH, and seated on the lower end rail portion to move along the lower end rail portion to be attached or detached.

13. The antenna device of claim 12, wherein the lower end rail portion comprises a guide groove for guiding the lower end slider in a direction in which the lower end slider gets adjacent to or goes away from the antenna module, and
   the lower end slider is formed to project from at least one of the lower portion of the RRH and a lower portion of the connection module to slidably move along the guide groove.

14. The antenna device of claim 13, wherein the RRH is pushed to be coupled to the antenna module after the RRH is seated in a slant line direction on a rear surface of the antenna module.

15. The antenna device of claim 14, wherein the hook member is seated on the locking bar member, the lower end slider is seated in the guide groove, and if the lower end slider moves from the guide groove toward the antenna module, the hook member is rotated on the locking bar member to cause the RRH to be coupled to the rear surface of the antenna module.

16. An antenna device comprising: an antenna module;
   a radio remote head (RRH) configured to receive signals from the antenna module and a base station;
   an attachment/detachment member configured to attach/detach the RRH to/from one surface of the antenna module;
   connection modules provided on a surface on which the antenna module and the RRH face each other to electrically connect the RRH and the antenna module to each other; and
   coupling modules provided on one surface of the RRH to move the connection modules so that the connection modules are coupled to or separated from each other;
   wherein the attachment/detachment member is provided on both side surfaces of the antenna module and the RRH as a link module configured to cause the both side surfaces of the RRH to be seated, to rotatably move the RRH from an upper portion to a lower portion of a rear surface of the antenna module, and to cause the RRH to be attached to or detached from the rear surface of the antenna module.

17. The antenna device of claim 16, wherein the link module comprises:
   at least one projection portion projecting from the both side surfaces of the RRH; and
   a link member provided on the both side surfaces of the antenna module, and including a coupling plate having at least one opening in which the projection portion is locked and coupled to the RRH, and a rotator rotatably supporting the coupling plate on the antenna module.

18. The antenna device of claim 17, wherein the RRH is seated to be spaced apart for a predetermined distance from the rear surface of the antenna module, and then moves from the upper portion to the lower portion of the rear surface of the antenna module to come in close contact with the rear surface of the antenna module, so that the RRH is coupled to the rear surface of the antenna module.

19. The antenna device of claim 18, wherein if the projection portion is locked in the opening, the RRH is coupled to be spaced apart for the predetermined distance from the rear surface of the antenna module, the rotator rotates the coupling plate, and the coupling plate moves in a direction from the upper portion to the lower portion thereof, so that the RRH is coupled to the rear surface of the antenna module.

* * * * *